United States Patent
Do et al.

(10) Patent No.: US 12,278,261 B2
(45) Date of Patent: Apr. 15, 2025

(54) CAPACITOR, ELECTRONIC DEVICE INCLUDING THE SAME, AND METHOD OF MANUFACTURING THE SAME

(71) Applicant: Samsung Electronics Co., Ltd., Suwon-si (KR)

(72) Inventors: Euncheol Do, Seoul (KR); Byunghoon Na, Suwon-si (KR); Kiyoung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 225 days.

(21) Appl. No.: 17/564,699

(22) Filed: Dec. 29, 2021

(65) Prior Publication Data

US 2023/0035431 A1 Feb. 2, 2023

(30) Foreign Application Priority Data

Jul. 23, 2021 (KR) .................. 10-2021-0097212

(51) Int. Cl.
  *H10B 12/00* (2023.01)
  *H01G 4/33* (2006.01)
  *H01L 49/02* (2006.01)

(52) U.S. Cl.
  CPC .............. *H01L 28/75* (2013.01); *H01G 4/33* (2013.01); *H01L 28/55* (2013.01); *H01L 28/91* (2013.01);
  (Continued)

(58) Field of Classification Search
  CPC .......... H01G 4/12; H01G 4/10; H01G 4/1218; H01G 4/1236; H01G 4/1254; H01G 4/20; H01G 4/33; H01G 7/06
  See application file for complete search history.

(56) References Cited

U.S. PATENT DOCUMENTS

| | | | |
|---|---|---|---|
| 5,471,364 A | 11/1995 | Summerfelt et al. | |
| 7,029,971 B2 * | 4/2006 | Borland ................. | H05K 1/162 438/251 |

(Continued)

FOREIGN PATENT DOCUMENTS

| | | | |
|---|---|---|---|
| CN | 111341561 A | * | 6/2020 |
| JP | 2003-045987 A | | 2/2003 |

(Continued)

OTHER PUBLICATIONS

Takeaki Yajima et al., "Controlling band alignments by artificial interface dipoles at perovskite heterointerfaces," Nature Communications 6, 6759, Apr. 7, 2015.

(Continued)

*Primary Examiner* — Edward Chin
(74) *Attorney, Agent, or Firm* — Harness, Dickey & Pierce, P.L.C.

(57) ABSTRACT

Provided are a capacitor, an electronic device including the same, and a method of manufacturing the same, the capacitor including a first thin-film electrode layer; a second thin-film electrode layer; a dielectric layer between the first thin-film electrode layer and the second thin-film electrode layer; and an interlayer between the dielectric and at least one of the first thin-film electrode layer or the second thin-film electrode layer, the interlayer including a same crystal structure type as and a different composition from at least one of the first thin film electrode layer, the second thin film electrode layer, or the dielectric layer, the interlayer including at least one of a anionized layer or a neutral layer.

36 Claims, 18 Drawing Sheets

(52) U.S. Cl.
CPC ....... *H10B 12/0387* (2023.02); *H10B 12/377* (2023.02)

(56) References Cited

U.S. PATENT DOCUMENTS

| | | | |
|---|---|---|---|
| 7,872,294 B2 | 1/2011 | Nakanishi | |
| 7,916,513 B2 | 3/2011 | Hu et al. | |
| 8,102,023 B2 | 1/2012 | Tanioku | |
| 8,317,563 B2* | 11/2012 | Yamauchi | H01J 9/261 |
| | | | 445/24 |
| 8,345,461 B2* | 1/2013 | Nawano | H10B 53/00 |
| | | | 257/295 |
| 10,910,383 B2 | 2/2021 | Kim et al. | |
| 11,094,778 B2 | 8/2021 | Kim et al. | |
| 2004/0146138 A1* | 7/2004 | Jiao | G01T 1/20183 |
| | | | 378/19 |
| 2008/0022514 A1* | 1/2008 | Anderson | H01M 4/8885 |
| | | | 29/623.5 |
| 2008/0123243 A1* | 5/2008 | Hamada | H01G 4/1236 |
| | | | 361/301.1 |
| 2009/0230511 A1 | 9/2009 | Park | |
| 2010/0110754 A1* | 5/2010 | Hu | H01L 28/56 |
| | | | 257/295 |
| 2011/0212382 A1* | 9/2011 | Randall | C01G 49/009 |
| | | | 264/618 |
| 2013/0071988 A1* | 3/2013 | Deweerd | H01L 28/40 |
| | | | 438/396 |
| 2013/0148262 A1* | 6/2013 | Shimizu | H01G 4/06 |
| | | | 361/311 |
| 2014/0167221 A1 | 6/2014 | Rui et al. | |
| 2014/0339550 A1* | 11/2014 | Shimoda | H01L 29/24 |
| | | | 257/532 |
| 2018/0286923 A1* | 10/2018 | Fischer | B28B 3/00 |
| 2019/0106805 A1* | 4/2019 | Evans | H01L 21/02266 |
| 2020/0212532 A1 | 7/2020 | Gosavi et al. | |
| 2021/0043749 A1 | 2/2021 | Lee et al. | |
| 2021/0066544 A1* | 3/2021 | Won | H01L 33/26 |
| 2021/0173487 A1* | 6/2021 | Ham | H04R 1/028 |
| 2021/0366456 A1* | 11/2021 | Jeong | G06F 3/16 |
| 2023/0178720 A1* | 6/2023 | Tomita | C01G 33/00 |
| | | | 429/229 |

FOREIGN PATENT DOCUMENTS

| | | |
|---|---|---|
| JP | 2010-165722 A | 7/2010 |
| JP | 4535076 B2 | 9/2010 |
| KR | 10-2018-0106149 A | 10/2018 |
| KR | 10-2019-0061857 A | 6/2019 |
| KR | 10-2021-0017526 A | 2/2021 |

OTHER PUBLICATIONS

Extended European Search Reported dated Sep. 26, 2022 issued in related European patent application No. 22164732.4.

Notice of Grounds of Rejection issued Dec. 4, 2023 in Japanese Application No. 2022-117303.

Communication pursuant to Article 94(3) issued Oct. 23, 2024 in European Application No. 22164732.4.

* cited by examiner

CAPACITOR, ELECTRONIC DEVICE INCLUDING THE SAME, AND METHOD OF MANUFACTURING THE SAME

CROSS-REFERENCE TO RELATED APPLICATION

This application is based on and claims priority under 35 U.S.C. § 119 to Korean Patent Application No. 10-2021-0097212, filed on Jul. 23, 2021, in the Korean Intellectual Property Office, the disclosure of which is incorporated by reference herein in its entirety.

BACKGROUND

1. Field

The present disclosure relates to a capacitor, an electronic device including the same, and a method of manufacturing the same.

2. Description of the Related Art

Dielectric layer including electronic devices, such as memory, capacitors, and transistors, are used in various household and industrial devices. According to the high performance of household and industrial devices, high integration and miniaturization of these electronic devices are progressing.

According to the high integration and miniaturization of these electronic devices, the sizes of these electronic devices are also being reduced. For example, since the capacitance of a capacitor decreases and the leakage current increases as the size of the capacitor decreases, various methods have been proposed to solve these problems.

For example, by increasing the electrode area of a capacitor and/or reducing the thickness of a dielectric to change the structure of the capacitor, and/or by improving a capacitor manufacturing process, the capacitance of the capacitor may be maintained even as the sizes of these electronic devices are also being reduced.

SUMMARY

However, there are limits to maintaining the capacitance of a capacitor by structural improvements (such as increasing the electrode area of the capacitor or reducing the thickness of a dielectric), and/or by improvements in manufacturing process.

Rather, for a higher capacitance of a capacitor, a ternary oxide dielectric material, may be used. A representative ternary oxide dielectric, as a ternary oxide including divalent cations and tetravalent cations, is a material with a perovskite crystal structure having a composition ratio of 1:1:3 of divalent cations, tetravalent cations, and oxygen. The ternary oxide dielectric may be, for example, a material such as $SrTiO_3$, $CaTiO_3$, $BaTiO_3$, $SrHfO_3$, $SrZrO_3$, $PbTiO_3$, and/or the like. For example, the ternary oxide dielectric is not limited to these materials, and ternary oxides including other cations may be used as the dielectric. However, a bandgap of the ternary oxide dielectric may be as small as 3 eV to 4 eV, and thus, a leakage current between an electrode and the dielectric may be large. Thus, it is important to suppress the leakage current between the electrode and the dielectric.

As a method for improving leakage current characteristics between the electrode and the dielectric, a method of controlling a Schottky barrier may be considered.

A Schottky barrier is the difference between the work function ($\Phi$) of an electrode and the electron affinity ($\chi$) of the dielectric film (e.g., of a dielectric). For example, when the electrode and the dielectric come into contact, the Fermi levels thereof become equal, and thus, an energy barrier called the Schottky barrier is formed at the interface between the electrode and the dielectric, suppressing the movement of charges, and thus improving the leakage current. In some examples, for example when the dielectric is and/or includes an N-type semiconductor, the greater the work function of the electrode is to the electron affinity of the dielectric, the greater the height of the Schottky barrier may be.

In order to implement a high Schottky barrier height (SBH) between the dielectric and the electrode, there should be satisfied the conditions that the crystal structures and lattice constants of the dielectric and the electrode are similar, the stability of the interface between the dielectric and the electrode is high, and the electrode work function is greater than the electron affinity of the dielectric. However, it is not easy to implement a capacitor with a high SBH between the dielectric and the electrode.

Therefore, there is provided a new capacitor that has an increased SBH between the dielectric and the electrode, compared to a capacitor of the related art, and thus, suppresses the leakage current.

One or more embodiments include a capacitor in which a leakage current is suppressed by including an interlayer having a novel structure.

One or more embodiments include an electronic device including the capacitor.

One or more embodiments include a method of manufacturing the capacitor.

Additional aspects will be set forth in part in the description which follows and, in part, will be apparent from the description, and/or may be learned by practice of the presented embodiments of the disclosure.

According to one or more embodiments, provided is a capacitor including: a first thin-film electrode layer; a second thin-film electrode layer; a dielectric layer between the first thin-film electrode layer and the-second thin film electrode layer; and an interlayer between the dielectric layer and at least one of the first thin-film electrode layer or the second thin-film electrode layer, the interlayer including a same crystal structure type as and a different composition from the at least one of the first thin-film electrode layer, the second thin-film electrode layer, or the dielectric layer, Wherein the interlayer includes at least one of a first anionized layer, a second anionized layer, or a first neutral layer, the first anionized layer including at least one of a monovalent cation, a divalent cation, or a trivalent cation that has an atomic weight of 20 or more, the second anionized layer including a monovalent cation, and the first neutral layer including a plurality of trivalent cations.

According to one or more embodiments, provided is an electronic device including the capacitor.

According to one or more embodiments, provided is a method of manufacturing the capacitor, the method including: providing a thin-film electrode layer; epitaxially growing an interlayer on a surface of the thin-film electrode layer; disposing a dielectric layer on the interlayer; and disposing another thin-film electrode layer on the dielectric layer, wherein the interlayer has the same type of a crystal structure as and a different composition from at least one of the thin-film electrode layer or the dielectric layer that contact the interlayer, the interlayer comprises at least one of a first anionized layer, a second anionized layer, or a first neutral layer, the first anionized layer includes at least one of a monovalent cation, a divalent cation, or a trivalent cation that has an atomic weight of 20 or more, the second anionized layer includes a monovalent cation, and the first neutral layer includes a plurality of trivalent cations.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1A:
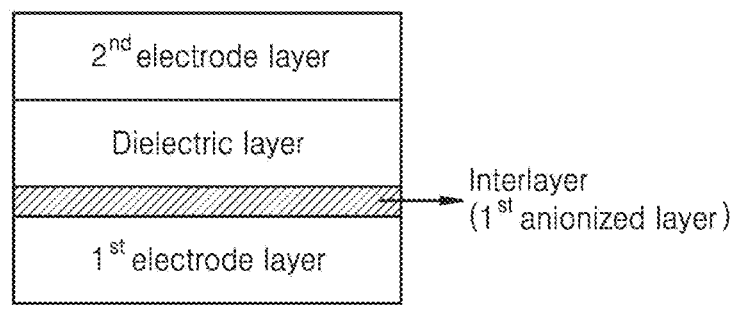
FIG. 1A shows a schematic view of a capacitor including an interlayer, according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which example embodiments are shown. The present disclosure may, however, be embodied in many different forms, should not be construed as being limited to the embodiments set forth herein, and should be construed as including all modifications, equivalents, and alternatives within the scope of the present disclosure; rather, these embodiments are provided so that this disclosure will be thorough and complete, and will fully convey the effects and features of the present disclosure and ways to implement the disclosure to those skilled in the art.

The terminology used herein is for the purpose of describing particular embodiments only and is not intended to be limiting of the present disclosure. As used herein, the singular forms "a," "an," and/or "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the slash "/" or the term "and/or" includes any and all combinations of one or more of the associated listed items.

In the drawings, the dimension, size, and/or thickness of each layer, region, and/or element may be exaggerated and/or reduced for clarity, better understanding, and/or ease of description, and thus the present disclosure is not limited thereto.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

It will also be understood that when an element such as a layer, a film, a region or a component is referred to as being "on" another layer or element, it can be "directly on" the other layer or element, or intervening layers, regions, or components may also be present. Although the terms "first", "second", etc., may be used herein to describe various elements, components, regions, and/or layers, these elements, components, regions, and/or layers should not be limited by these terms. These terms are used only to distinguish one component from another, not for purposes of limiting the elements, components, regions, and/or layers to e.g., an orientation, quantity, and/or order unless expressly indicated as otherwise. In the following description and drawings, constituent elements having substantially the same functional constitutions are assigned like reference numerals, and overlapping descriptions will be omitted.

Hereinafter, some example embodiments of a dielectric, a capacitor including the dielectric, an electronic device including the same, and a method of manufacturing the capacitor will be described in greater detail.

A capacitor according to some example embodiments includes: a first thin film electrode layer; a second thin film electrode layer; a dielectric layer arranged between the first thin film electrode layer and the second thin film electrode layer; and an interlayer arranged between the dielectric layer and at least one of the first thin-film electrode layer or the second thin-film electrode layer, wherein the interlayer has the same type of a crystal structure as and a different composition from at least one of the first thin film electrode layer, the second thin film electrode layer and the dielectric layer that contact the interlayer, the interlayer includes a first anionized layer, includes a second anionized layer, or includes a first neutral layer, the first anionized layer includes a monovalent cation, a divalent cation, or a trivalent cation that has an atomic weight of 20 or more, the second anionized layer includes a monovalent cation, and the first neutral layer includes a plurality of trivalent cations. For example, the first anionized layer may include a monovalent cation, a divalent cation, or a trivalent cation that has an atomic weight of 40 or more.

By including the first anionized layer, the second anionized layer, or the first neutral layer, the interlayer may induce screening charge in a thin-film electrode layer adjacent thereto. The screening charge may induce an additional electrostatic potential difference between the thin-film electrode layer and the dielectric layer. A Schottky barrier height (SBH) between the thin-film electrode layer and the dielectric layer may be increased, and as a result, leakage current of the capacitor including the interlayer may be reduced. For example, when the first anionized layer and the second anionized layer have negative charges, a screening charge with a positive charge may be induced in the adjacent thin-film electrode layer. For example, when the first neutral layer is entirely neutral, by including a third positive charge layer and a first negative charge layer in the neutral layer, screening charge may be induced in the adjacent thin-film electrode layer. As a result, the leakage current of the capacitor including such an interlayer is reduced.

Figure 1B:
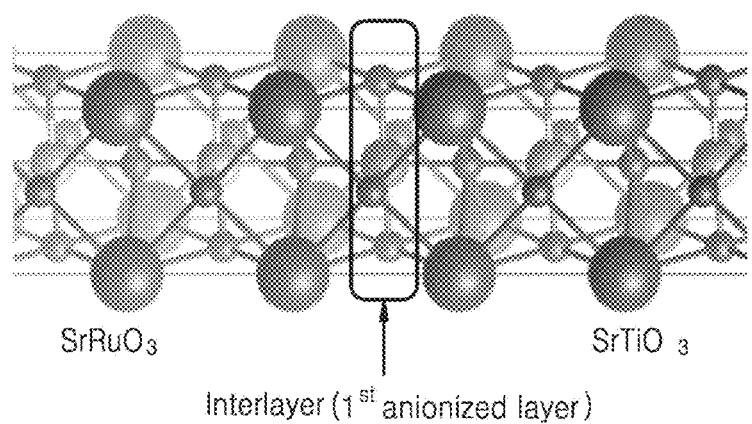
FIG. 1B shows a schematic view showing a magnified structure of an interlayer portion of a capacitor including an interlayer, according to some example embodiments.

Referring to FIGS. 1A and 1B, a capacitor according to some example embodiment includes a first thin film electrode layer; a second thin film electrode layer; a dielectric layer arranged between the first thin film electrode layer and the second thin film electrode layer; and an interlayer arranged between the dielectric layer and at least one of the first thin film electrode layer and/or the second thin film electrode layer. The interlayer may include a first anionized layer, as described below. The first thin film electrode layer, the second thin film electrode layer, the dielectric layer, and/or the interlayer may have, for example, a perovskite-type crystal structure.

A perovskite-type crystal structure may include a structure may include a structure that mimics the crystal structure of perovskite. For example, the perovskite-type crystal structure may include a first and second cations and an anion that binds the first and second cations. The perovskite-type crystal structure may have, e.g., a composition represented by ABOx (wherein 0<x≤3). For example, the perovskite-type crystal structure may have a composition of $ABO_3$, wherein A is located at a cuboctahedral site coordinated with twelve (12) oxygen atoms, and B is located at an octahedral site coordinated with six (6) oxygen atoms. For example, the dielectric layer may include a ternary oxide ($ABO_3$) having a perovskite crystal structure consisting of divalent A cations and tetravalent B cations. The ternary oxide included in the dielectric layer may be, for example, $SrTiO_3$, $CaTiO_3$, $BaTiO_3$, $SrHfO_3$, $SrZrO_3$, and/or $PbTiO_3$. However, the ternary oxide included in the dielectric layer is not limited thereto, and may be a perovskite-type ternary oxide including other (e.g., different) cations.

In some example embodiments, the first anionized layer may have a composition represented by $[B1O_2]^{-a}$. "B1" may be, for example, a monovalent cation, a divalent cation, and/or a trivalent cation that has an atomic weight of 20 or more, and/or 40 or more, and "a" may be 1, 2, or 3. For example, the composition of the anionized layer may include a negative charge of 1, 2, and/or 3. A leakage current may be more effectively suppressed in a capacitor that includes such a first anionized layer. For example, B1 included in the first anionized layer may be located at an octahedral site coordinated with six (6) oxygen atoms in the perovskite structure.

In some example embodiments, B1 may include an alkali metal element that forms a monovalent cation (e.g. at least one of Li, Na, K, Rb and/or Cs); an alkaline earth metal element that forms a divalent cation (e.g., at least one of Mg, Be, Ba and/or Ca), and/or a metal of Group 13 of the periodic table of the elements that forms a trivalent cation (e.g., at least one of Ga and/or In). As discussed above, when the interlayer includes B1 as such an element the capacitor can effectively induce an increased Schottky barrier height (SBH).

However, when B1 is a trivalent cation of an element of an atomic weight less than 20 (and/or less than 40), due to a significant difference in ionic radii with metal cation(s) included in the electrode and/or dielectric, the structural stability of the interlayer may be reduced. Thus, the capacitor having the interlayer including a trivalent cation of an atomic weight less than 20 (and/or less than 40) may have reduced structural stability.

The first anionized layer may have a composition be represented by, for example, $[GaO_2]^-$, $[InO_2]^-$, $[BeO_2]^{-2}$, $[MgO_2]^{-2}$, $[BaO_2]^{-2}$, $[CaO_2]^{-2}$, $[LiO_2]^{-3}$, $[NaO_2]^{-3}$, $[KO_2]^{-3}$, and/or $[RbO_2]^{-3}$. As discussed above, when the interlayer includes such a first anionized layer, the leakage current of the capacity can be further and/or effectively suppressed. In some example embodiments, the first anionized layer may be identified using, for example, electron microscopy (e.g., high-angle annular dark-field-scanning transmission electron microscopy (HAADF-STEM)). In some example embodiments, e.g., wherein the interlayer is between a dielectric and an electrode layer including the same element A (e.g., as illustrated in FIG. 1B), the interface including the dielectric layer, interlayer, and electrode layer may include a composition that mimics and/or includes a perovskite-type crystal structure of $AB1 O_x$.

In some example embodiments, the interlayer may further include, in addition to the first anionized layer, a neutral layer (hereafter a "second neutral layer").

The second neutral layer may have a composition represented by, for example, [A1O]. Here, A1 may be, for example, a divalent cation. A1 may be a cation coordinated with 12 oxygen atoms in the dielectric material constituting the capacitor. The composition of the second neutral layer may depend, for example, on the A-site material of the dielectric material used. For example, element A1 of the second neutral layer and the element A of the dielectric material the second neutral layer may be the same such that A1 may be [SrO] when the dielectric is $SrTiO_3$, $SrHfO_3$, and/or $SrZrO_3$, [CaO] when the dielectric is $CaTiO_3$, [BaO] when the dielectric is $BaTiO_3$, and/or [PbO] when the dielectric is $PbTiO_3$.

In some example embodiments, when the interlayer further includes the second neutral layer, the structural stability of the first anionized layer may be improved. In addition, structural similarities of the interlayer with the thin film electrode layer and the dielectric layer may be increased, and the overall structural stability of the interlayer may be improved. Consequentially, the structural stability of the capacitor may be improved. The second neutral layer may be identified using, for example, electron microscopy (e.g., HAADF-STEM).

The interlayer in some example embodiments may include, for example, the first anionized layer and the second neutral layer, and the first anionized layer and the second neutral layer may be alternately stacked. For example, the first anionized layer and the second neutral layer may be sequentially stacked on a (001) plane of the thin film electrode layer and/or the dielectric layer along the [001] direction. For example, the order in which the first anionized layer and the second neutral layer are stacked may be changed and/or selected depending on the surface structure of the base on which the interlayer is stacked (e.g., the thin electrode layer and/or the dielectric layer).

The first anionized layer and the second neutral layer included in the interlayer may each independently include different metal elements. The first anionized layer and the second neutral layer may each independently include a different material, and thus the interlayer may have, for example, a perovskite-type crystal structure. For example, the interlayer including the first anionized layer and the second neutral layer may include a composition that mimics a perovskite-type crystal structure.

The interlayer includes the first anionized layer and the second neutral layer, and thus may be composed of a compound. The compound that forms the interlayer may be unstable in a bulk state, but may maintain stability when it has a thickness of several nanometers. For example, the interlayer may include, for example, a metal oxide that is represented by Formula 1:

$$[A1B1O_x] \qquad \text{<Formula 1>}$$

In Formula 1, A1 is a divalent cation, B1 is a monovalent cation, a divalent cation, or a trivalent cation that has an atomic weight of 20 or more and/or $2.5 < x \leq 3.0$.

In some example embodiments, for example, B1 may be a monovalent cation, a divalent cation, or a trivalent cation of an atomic weight of 40 or more.

The interlayer may include a metal oxide including at least one of $[SrGaO_x]$, $[CaGaO_x]$, $[BaGaO_x]$, $[PbGaO_x]$, $[SrInO_x]$, $[CaInO_x]$, $[BaInO_x]$, $[PbInO_x]$, $[SrBeO_x]$, $[CaBeO_x]$, $[BaBeO_x]$, $[PbBeO_x]$, $[SrMgO_x]$, $[CaMgO_x]$, $[BaMgO_x]$, $[PbMgO_x]$, $[SrBaO_x]$, $[CaBaO_x]$, $[PbBaO_x]$, $[SrCaO_x]$, $[BaCaO_x]$, $[PbCaO_x]$, $[SrLiO_x]$, $[CaLiO_x]$, $[BaLiO_x]$, $[PbLiO_x]$, $[SrNaO_x]$, $[CaNaO_x]$, $[BaNaO_x]$, $[PbNaO_x]$, $[SrKO_x]$, $[CaKO_x]$, $[BaKO_x]$, $[PbKO_x]$, $[SrRbO_x]$, $[CaRbO_x]$, $[BaRbO_x]$, and/or $[PbRbO_x]$, wherein $2.5 < x \leq 3.0$.

Figure 2A:
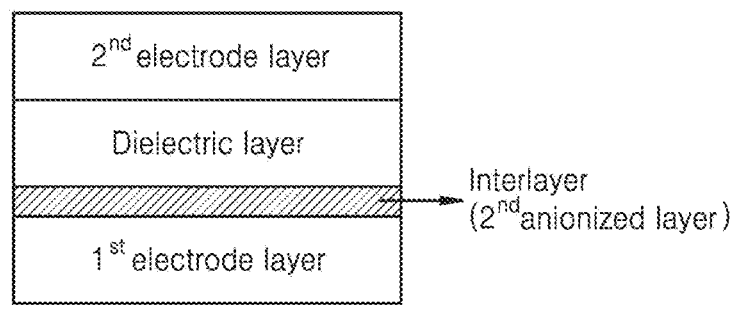
FIG. 2A shows a schematic view of a capacitor including an interlayer, according to some example embodiments.
Figure 2B:
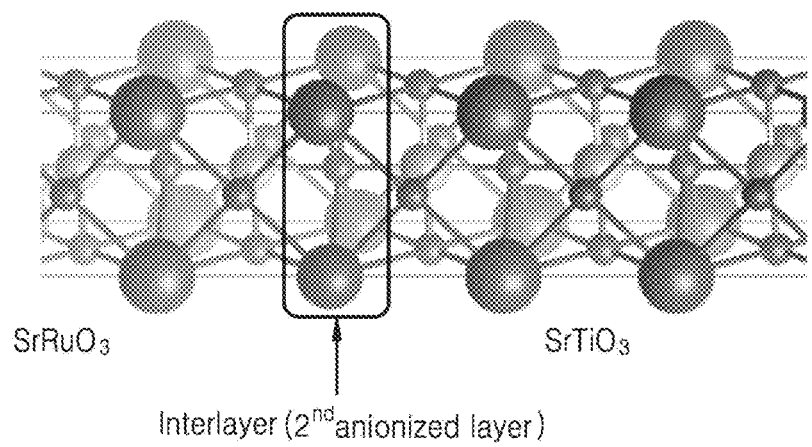
FIG. 2B shows a schematic view showing a magnified structure of an interlayer portion of a capacitor including an interlayer, according to some example embodiments.

Referring to FIGS. 2A and 2B, a capacitor according to some example embodiments may include a first thin film electrode layer; a second thin film electrode layer; a dielectric layer arranged between the first thin film electrode layer and the second thin film electrode layer; and an interlayer arranged between the dielectric layer and at least one of the first thin film electrode layer and/or the second thin film electrode layer. The first thin film electrode layer, the second thin film electrode layer, the dielectric layer, and the interlayer may have, for example, a perovskite-type crystal structure. The first thin film electrode layer, the second thin film electrode layer, and/or the dielectric layer may be substantially similar to the first thin film electrode layer, the second thin film electrode layer, and/or the dielectric layer described above, and thus, additional description will be omitted to avoid redundancy.

The interlayer may include an anionized layer. Herein, the anionized layer of FIGS. 2A and 2B is referred to as a second anionized layer to distinguish the anionized layer of FIGS. 2A and 2B from the "first anionized layer" of FIGS. 1A and 1B.

For example, the second anionized layer may be represented by $[A2O]^-$. Here, A2 may be, for example, a monovalent cation. The capacitor including such a second anionized layer, may effectively suppress a leakage current of the capacitor. A2 included in the second anionized layer may be located at a cuboctahedral site coordinated with twelve (12) oxygen atoms in the perovskite structure.

For example, A2 may include at least one of Li, Na, K, Rb, and/or Cs as an alkali metal element that forms a monovalent cation. As discussed above, when the interlayer includes A2 as such an element, the capacitor may effectively induce an increased Schottky barrier height (SBH).

For example, the second anionized layer may include a composition represented by at least one of $[LiO]^-$, $[NaO]^-$, $[KO]^-$, and/or $[RbO]^-$. The second anionized layer may be identified using, for example, electron microscopy (e.g., HAADF-STEM).

The interlayer may further include, in addition to the second anionized layer, a neutral layer. Herein, the neutral layer of the interlayer of FIGS. 2A and 2B is referred to as a third neutral layer to distinguish the neutral layer of FIGS. 2A and 2B from the "second neutral layer" of FIGS. 1A and 1B.

The third neutral layer may include a composition represented by $[B2O2]$. Here, B2 is a cation, e.g., a tetravalent cation, coordinated with six (6) oxygen atoms in the dielectric layer material. In some embodiments, the element B2 may be the same as an element B of a neighboring perovskite-type crystal structure. For example, wherein the dielectric material includes a composition such as $SrTiO_3$, $CaTiO_3$, $BaTiO_3$, $SrHfO_3$, $SrZrO_3$, and/or $PbTiO_3$, B2 may be, for example, Ti, Hf, and/or Zr. For example, the third neutral layer may be represented by $[TiO_2]$, $[ZrO_2]$, or $[HfO_2]$.

When the interlayer further includes the third neutral layer the structural stability of the second anionized layer may be improved. In addition, structural similarities of the interlayer with the thin film electrode layer and the dielectric layer may be increased, and the overall structural stability of the interlayer may be improved. Consequentially, the structural stability of the capacitor may be improved. The third neutral layer may be identified using, for example, electron microscopy (e.g., HAADF-STEM).

The interlayer may, thus, include, for example, the second anionized layer and the third neutral layer, and the second anionized layer and the third neutral layer may be alternately stacked. For example, the second anionized layer and the third neutral layer may be sequentially stacked on a (001) plane of the thin film electrode layer or the dielectric layer along the [001] direction. For example, the order in which the second anionized layer and the third neutral layer are stacked may be changed and/or selected depending on the surface structure of the base on which the interlayer is stacked (e.g., the thin film electrode layer and/or the dielectric layer).

The second anionized layer and the third neutral layer included in the interlayer may each independently include different metal elements. The second anionized layer and the third neutral layer may each independently include a different material, and thus the interlayer may have, for example, a perovskite-type crystal structure. For example, the interlayer including the first anionized layer and the second neutral layer may include a composition that mimics a perovskite-type crystal structure.

The interlayer includes the second anionized layer and the third neutral layer, and thus may be composed of a compound. The compound that forms the interlayer may be unstable in a bulk state, but may maintain stability when it has a thickness of several nanometers. The interlayer may include, for example, a metal oxide that is represented by Formula 2:

[A2B2O$_x$]     <Formula 2>

In Formula 2, A2 is a monovalent cation, B2 is a tetravalent cation, and/or $2.5 < x \leq 3.0$.

For example, the interlayer may include a metal oxide including at least one of [LiTiO$_x$], [NaTiO$_x$], [KTiO$_x$], [RbTiO$_x$], [LiZrO$_x$], [NaZrO$_x$], [KZrO$_x$], [RbZrO$_x$], [LiHfO$_x$], [NaHfO$_x$], [KHfO$_x$], and/or [RbHfO$_x$], wherein $2.5 < x \leq 3.0$.

Figure 3A:
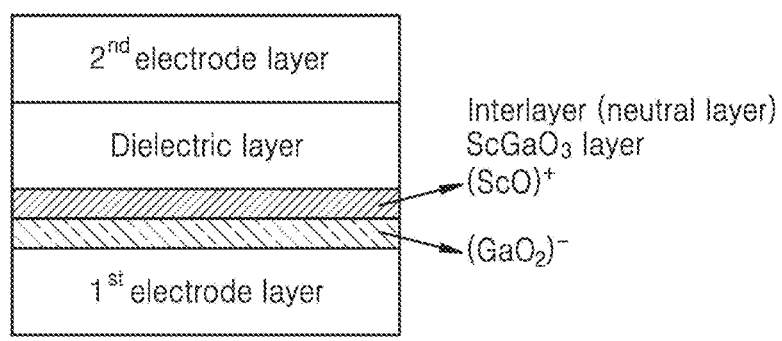
FIG. 3A shows a schematic view of a capacitor including an interlayer, according to some example embodiments.
Figure 3B:
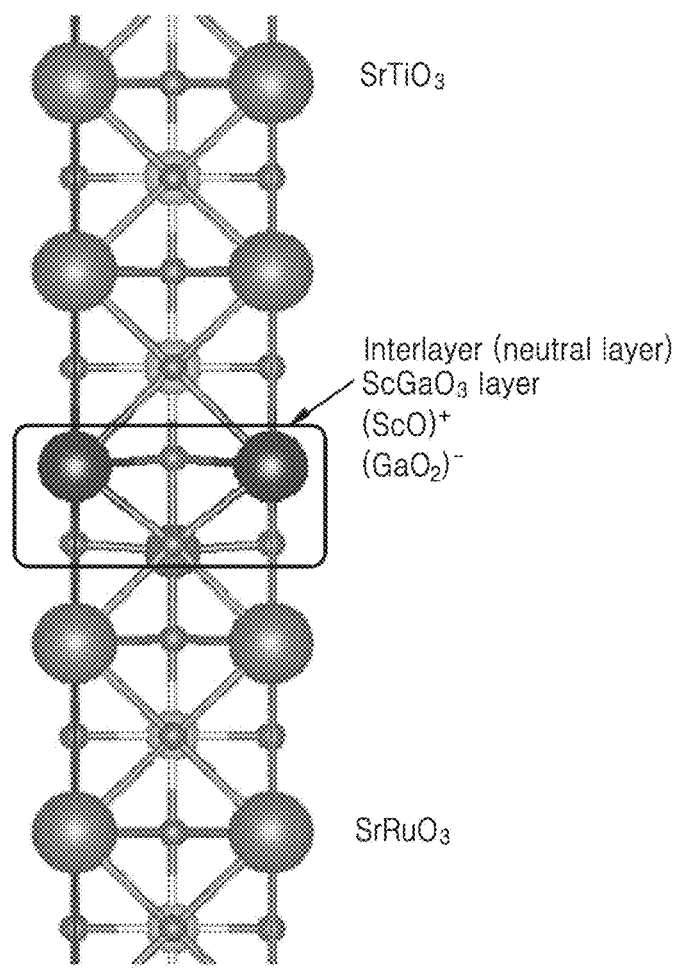
FIG. 3B shows a schematic view showing a magnified structure of an interlayer portion of a capacitor including an interlayer, according to some example embodiments.

Referring to FIGS. 3A and 3B, a capacitor according to some example embodiments includes: a first thin film electrode layer; a second thin film electrode layer; a dielectric layer arranged between the first thin film electrode layer and the second thin film electrode layer; and an interlayer arranged between the dielectric layer and at least one of the first thin film electrode layer and the second thin film electrode layer. The first thin film electrode layer, the second thin film electrode layer, the dielectric layer, and the interlayer may have, for example, a perovskite-type crystal structure. The first thin film electrode layer, the second thin film electrode layer, and/or the dielectric layer may be substantially similar to the first thin film electrode layer, the second thin film electrode layer, and/or the dielectric layer described above, and thus, additional description will be omitted to avoid redundancy.

The interlayer may include a neutral layer. Herein the neutral layer of FIGS. 3A and 3B are referred to as a first neutral layer to distinguish the neutral layer of FIGS. 3A and 3B from the "second neutral layer" of FIGS. 1A and 1B and the "third neutral layer" of FIGS. 2A and 2B.

For example, the interlayer may be the first neutral layer. The first neutral layer may include, for example, a metal oxide that is represented by Formula 3 and has a perovskite-type crystal structure:

[A3B3O$_3$]     <Formula 3>

In Formula 3, A3 is a trivalent cation, and B3 is a trivalent cation.

For example, A3 and B3 may be different metals from each other.

For example, the first neutral layer may include a metal oxide represented by at least one of [ScAlO$_3$], [YAlO$_3$], [LaAlO$_3$], [CeAlO$_3$], [PrAlO$_3$], [NdAlO$_3$], [SmAlO$_3$], [DyAlO$_3$], [ScGaO$_3$], [YGaO$_3$], [LaGaO$_3$], [CeGaO$_3$], [PrGaO$_3$], [NdGaO$_3$], [SmGaO$_3$], [DyGaO$_3$], [ScInO$_3$], [YInO$_3$], [LaInO$_3$], [CeInO$_3$], [PrInO$_3$], [NdInO$_3$], [SmInO$_3$], and/or [DyInO$_3$].

The compound that forms the first neutral layer may be unstable in a bulk state, but may maintain stability when it has a thickness of several nanometers.

The first neutral layer may include a cationized layer (hereafter "a first cationized layer") and an anionized layer (hereafter "third anionized layer"). The first neutral layer including the first cationized layer and the third anionized layer may be structurally stable, and the structural similarities of the interlayer including the first neutral layer with the thin film electrode layer and the dielectric layer may be increased. Thus, the overall structural stability of the interlayer may be improved. Consequentially, the structural stability of the capacitor may be improved. The first neutral layer may be identified using, for example, electron microscopy (e.g., HAADF-STEM).

The first cationized layer may be represented by [A3O]+. Here, A3 may be a trivalent cation. A3 included in the first cationized layer may be located at a cuboctahedral site coordinated with twelve (12) oxygen atoms in the perovskite structure. For example, A3 may include, as a Group 3 metal element that forms a trivalent cation (e.g., at least one of Sc, Y, La, Ce, Pr, Nd, Sm, and/or Dy). For example, the first cationized layer may include a composition represented by at least one of [ScO]+, [YO]+, [LaO]+, [CeO]+, [PrO]+, [NdO]+, [SmO]+, and/or [DyO]+.

The third anionized layer may be represented by [B3O2]−. Here, B3 may be a trivalent cation. For example, B3 included in the third anionized layer may be located at an octahedral site coordinated with six (6) oxygen atoms in the perovskite structure. For example, B3 may include a trivalent cation of a Group 13 element (e.g., at least one of Al, Ga, and/or In For example, the third anionized layer may include a composition represented by at least one of [AlO$_2$]−, [GaO$_2$]−, and/or [InO$_2$]−.

The first neutral layer includes the first cationized layer and the third anionized layer may effectively induce an increased Schottky barrier height (SBH). Therefore, when the interlayer includes such a first neutral layer, a leakage current of the capacitor may be further effectively suppressed. The first cationized layer and the third anionized layer may be identified using, for example, electron microscopy (e.g., HAADF-STEM).

Figure 4A:
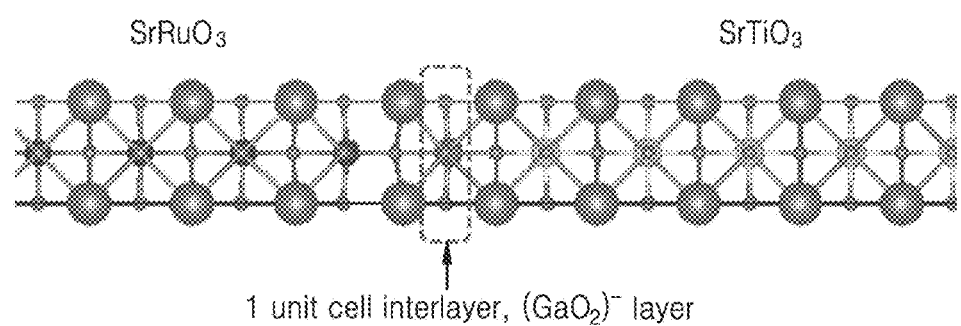
FIG. 4A shows a schematic view showing a magnified structure of an interlayer portion of a capacitor including an interlayer, according to some example embodiments.
Figure 4B:
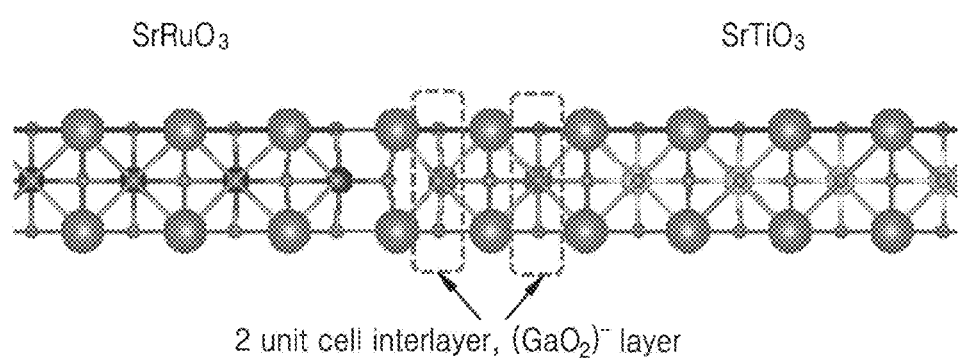
FIG. 4B shows a schematic view showing a magnified structure of an interlayer portion of a capacitor including an interlayer, according to an embodiment.

FIGS. 4A and 4B show schematic views showing magnified structures of an interlayer portion of a capacitor including an interlayer (e.g., at least one of the capacitors illustrated in FIGS. 1A, 2A, and/or 3A), according to some example embodiment.

Referring to FIGS. 4A and 4B, the interlayer may include, for example one to three unit cells, and/or one to two unit cells.

A thickness of the interlayer may be, for example, about 1 angstrom (Å) to about 15 angstrom (Å), e.g., about 2 Å to about 12 Å, and/or about 2 Å to about 10 Å. In some example embodiments, an interlayer having a thickness within these ranges, may have an increased Schottky barrier height (SBH) while maintaining structural stability.

In the capacitor including the interlayer, a SBH between the first thin film electrode layer (and/or the second thin film electrode layer) and the dielectric layer may be 1.5 eV or more, (e.g., 1.8 eV or more).

For example, in the capacitor(s) including the interlayer(s) described above, a SBH between the first thin film electrode layer (and/or the second thin film electrode layer) and the dielectric layer may be about 1.5 eV to about 2.5 eV, and/or about 1.8 eV to about 2.1 eV.

The interlayer may be formed by, for example, epitaxial growth. Accordingly, the interlayer may have a similar (and/or same) crystal structure; a similar and/or same lattice constant; and/or the like as that of the thin film electrode layer and/or the dielectric layer, and may thus have improved interfacial stability.

Referring to FIGS. 1A and 4B, the capacitor according to one or more embodiments includes: a first thin film electrode layer; a second thin film electrode layer; a dielectric layer arranged between the first thin film electrode layer and the second thin film electrode layer; and an interlayer arranged between the dielectric layer and at least one of the first thin film electrode layer or the second thin film electrode layer. The dielectric included in the dielectric layer is not specifically limited, and may be another material used as a dielectric in the technical field. A dielectric constant of the dielectric at room temperature (25° C.) in a range of 1 kHz to 1 MHz may be, for example, 50 or more, 100 or more, 250 or more, and/or 500 or more; and/or the dielectric constant of the dielectric at room temperature (25° C.) may be in a range of 1 kHz to 1 MHz may be, for example, 100,000 or less, 50,000 or less, 10,000 or less, 5000 or less, 1000 or less, or 500 or less. For example, the dielectric constant of the dielectric at room temperature (25° C.) in a range of 1 kHz to 1 MHz may be about 100 to about 100,000, about 100 to about 10,000, about 100 to about 1000, and/or about 100 to about 500.

The dielectric layer may include, for example, a dielectric has a perovskite-type crystal structure and that is represented by Formula 4:

   <Formula 4>

In Formula 4, A4 is a monovalent, divalent, or trivalent cation, and B4 is a trivalent, tetravalent, or pentavalent cation.

The dielectric layer may include, for example, a dielectric including at least one of $SrTiO_3$, $CaTiO_3$, $BaTiO_3$, $SrHfO_3$, $CaHfO_3$, $BaHfO_3$, $SrZrO_3$, $CaZrO_3$, $BaZrO_3$, $PbTiO_3$, $NaNbO_3$, $NaTaO_3$, $RbTaO_3$, $RbNbO_3$, $RbTaO_3$, and/or $EuTiO_3$.

A thickness of the dielectric layer included in the capacitor may be more than 10 nm and/or less than 100 nm, for example, about 10 nm to about 100 nm. When the thickness of the dielectric layer excessively increases, the capacitance per unit volume of the capacitor may be reduced. In addition, when the thickness of the dielectric layer is excessively small, a proportion of a dielectric constant reduction region in the interface may be increased, and thus the capacitance per unit volume of the capacitor may be reduced.

A thickness of each of the first thin film electrode layer and/or the second thin film electrode layer included in the capacitor may be, for example, about 10 nm to about 1000 nm, and/or about 10 nm to about 100 nm. When the thickness of the thin film electrode layer excessively increases, the capacitance per unit volume of the capacitor may be reduced. In addition, when the thickness of the thin film electrode layer is excessively small and the thickness of the dielectric layer is excessively small, a proportion of the dielectric constant reduction region in the interface may be increased, and thus the capacitance per unit volume of the capacitor may be reduced.

At least one of the first thin film electrode layer and the second thin film electrode layer included in the capacitor may have a perovskite-type crystal structure. The thin film electrode layers have a perovskite-type crystal structure, and thus may have improved interfacial stability with the dielectric layer.

The capacitor includes the interlayer described above, and thus the capacitor may have an increased capacitance and reduced leakage current. The type of the capacitor is not specifically limited. The capacitor may be, for example, a capacitor device used in memory cells, a stacked capacitor used in stacked ceramic condensers, and/or the like.

Figure 5A:
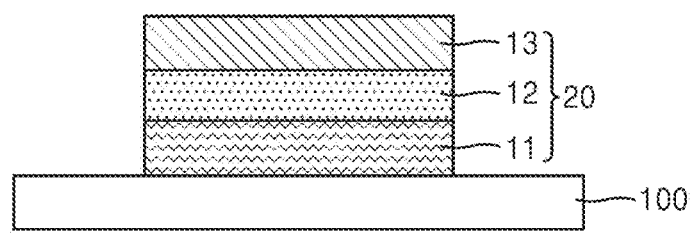
FIGS. 5A to 5D show schematic views of capacitors according to some example embodiments.

FIG. 5A shows a structure of a capacitor 20 including the interlayer (not shown) described above. The structure includes an insulating substrate 100, a first thin film electrode 11 and a second thin film electrode as a pair of electrodes, and a dielectric layer 12. The first thin film electrode 11 and the second thin film electrode 13 function as a lower thin film electrode and an upper thin film electrode, respectively. The first thin film electrode 11 and the second thin film electrode 13 are spaced apart (e.g., by the dielectric layer 12 and interlayer) do not electrically contact each other, and the dielectric layer 12 is arranged between the first thin film electrode 11 and the second thin film electrode 13. An interlayer (not shown) is arranged between the first thin film electrode 11 and the dielectric layer 12 and/or between the second thin film electrode 13 and the dielectric layer 12.

Figure 5B:
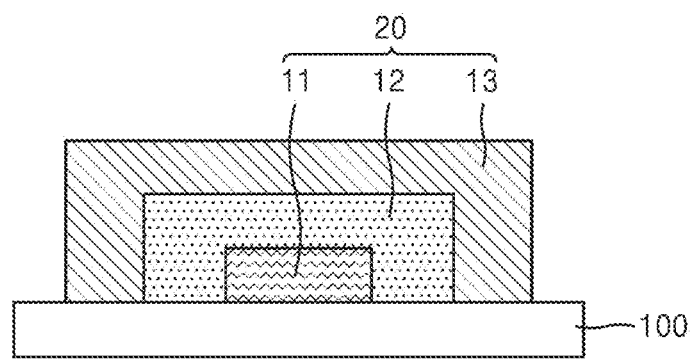
Figure 5C:
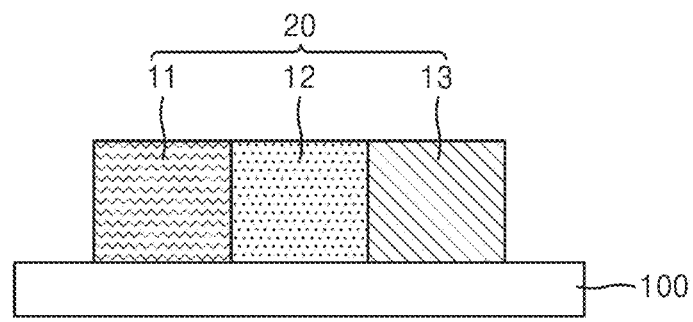
Figure 5D:
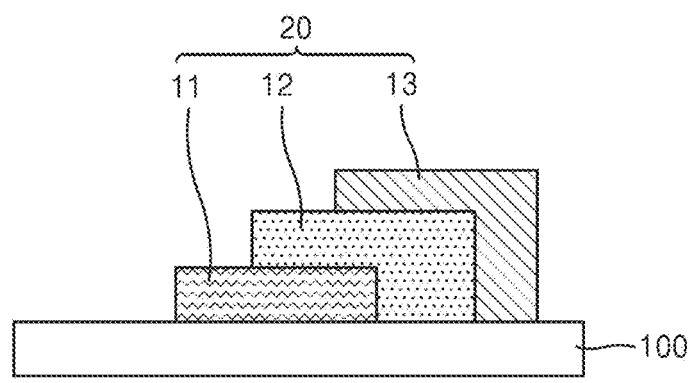

FIGS. 5B to 5D show other examples of structures of capacitors 20, each including the interlayer (not shown) described above.

Referring to FIG. 5B, a dielectric layer 12 is arranged so as to coat a first thin film electrode 11 on an insulating substrate 100, and a second thin film electrode 13 is arranged so as to coat the dielectric layer 12. The interlayer (not shown) is arranged between the first thin film electrode 11 and the dielectric layer 12 and/or between the second thin film electrode 13 and the dielectric layer 12.

Referring to FIG. 5C, a first thin film electrode 11 and a second thin film electrode 13 are arranged on an insulating substrate 100, and a dielectric layer 12 is arranged therebetween. The interlayer (not shown) is arranged between the first thin film electrode 11 and the dielectric layer 12 and/or between the second thin film electrode 13 and the dielectric layer 12.

Referring to FIG. 5D, a dielectric layer 12 is arranged so as to coat a portion of a first thin film electrode 11 on an insulating substrate 100, and a second thin film electrode 13 is arranged so as to coat a portion of the dielectric layer 12. The interlayer (not shown) is arranged between the first thin film electrode 11 and the dielectric layer 12 and/or between the second thin film electrode 13 and the dielectric layer 12.

Figure 6:
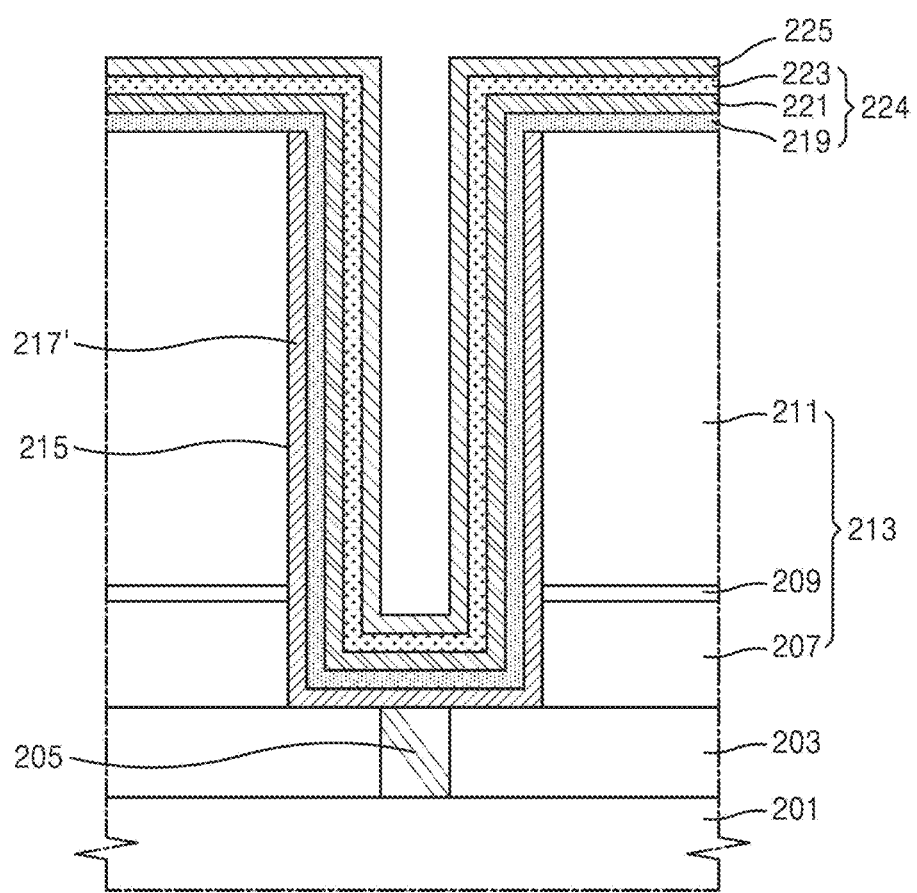
FIG. 6 is a cross-sectional view showing a structure of a metal-insulator-metal capacitor (MIM capacitor) according to some example embodiments.

FIG. 6 shows a structure of a metal-insulator-metal (MIM) capacitor according to some example embodiments.

Referring to FIG. 6, an interlayer insulating film 203 is stacked on a semiconductor substrate 201, and formed in the interlayer insulating film 203 is a contact plug 205 filling a contact hole that exposes the semiconductor substrate 201. A mold insulating film 213 is formed on the substrate having the contact plug 205. The mold insulating film 213 has a structure in which a lower mold insulating film 207, an etch stop film 209, and an upper mold film 211 are sequentially stacked on the substrate having the contact plug 205. The etch stop film 209 is not limited to the position illustrated in FIG. 6, and may be, e.g., directly formed on the upper surfaces of the contact plug 205 and the interlayer insulating film 203. In some example embodiments, the mold insulating film 213 may be formed as a double-layered mold insulating film including the lower mold insulating film 207 and the upper mold insulating film 211, or as a single mold insulating layer. The lower mold insulating film 207 and the upper mold insulating film 211 may have an etch selectivity with respect to the etch stop film 209. For example, when the lower mold insulating film 207 and the mold insulating film 213 are formed of a silicon oxide film, the etch stop film 209 may be formed of a silicon nitride film. The mold insulating film 213 is patterned to form a storage node hole 215 that exposes the upper surface of the contact plug 205 and the upper surface of the interlayer insulating film 203.

A lower-electrode film 217' may include a conductive film (e.g., for a lower electrode) and may be formed on the entire surface of the semiconductor substrate having the storage node hole 215. The conductive film 217' for a lower electrode may be formed as a conductive film that has excellent step coverage, is less deformed during a subsequent process of forming a dielectric film, and has an oxidation resistant property. For example, the conductive film for a lower electrode 217' may be formed of a metal oxide including at least one of strontium-ruthenium oxide ($SrRuO_3$), iridium-ruthenium oxide ($SrIrO_3$), calcium-ruthenium oxide (CaRuO$_3$), calcium-nickel oxide (CaNiO$_3$), barium-ruthenium oxide (BaRuO$_3$), and/or barium-strontium-ruthenium oxide ((Ba,Sr)RuO$_3$).

A buffer insulating film 219 may act as a lower dielectric film, and may be formed on the conductive film for a lower electrode 217'. For example, a lower electrode 217' and a buffer insulating-film pattern (not shown) the storage node hole 215 may be formed. The buffer insulating film pattern (not shown) may have a structure that is selectively removed to expose the inner wall of the lower electrode (217'). A dielectric film 224 in which a lower dielectric film 219 and an upper dielectric film 223 are sequentially stacked is formed over the entire surface of the semiconductor substrate 201 having the lower electrode 217'. The lower dielectric film 219 and the upper dielectric film 223 may contain a dielectric. For example, the upper dielectric film 223 may be formed of a high-k dielectric film having a higher dielectric constant than the lower dielectric film 219. In addition, the lower dielectric film 219 may form a dielectric film having a higher energy bandgap compared to the upper dielectric film 223.

For example, at least one of the lower dielectric film 219 and/or the upper dielectric film 223 may be formed of a metal oxide film including at least one of strontium-titanium oxide (SrTiO$_3$), lithium-niobium oxide (LiNbO$_3$,), potassium-niobium oxide (KNbO$_3$), potassium-thallium oxide (KTaO$_3$), barium-titanium oxide (BaTiO$_3$), sodium-niobium oxide (NaNbO$_3$), sodium-thallium oxide (NaTaO$_3$), calcium-zirconium oxide (CaZrO$_3$), barium-zirconium oxide (BaZrO$_3$), and/or strontium-zirconium oxide (SrZrO$_3$).

In some example embodiments, although not illustrated, the lower dielectric film 219 and the upper dielectric film 223 may form a single dielectric film, and this single dielectric film may be formed of a metal oxide film as listed above.

An upper electrode 225 is formed on the upper dielectric layer 223, and the upper electrode 225 may be formed of a metal film having a work function greater than that of the lower electrode 217'.

The upper electrode 225 may be formed of at least one noble metal film selected from among a Ru film, a Pt film, and an Ir film.

For example, the upper dielectric film 223 may be formed of at least one of a Ta$_2$O$_5$ film, a TiO$_2$ film, a doped TiO$_2$ film, and/or an STO film, and the lower dielectric film 219 may be formed of at least one of an HfO$_2$ film, a ZrO$_2$ film, an Al$_2$O$_3$ film, and/or a La$_2$O$_3$ film.

For example, the upper dielectric film 223 and the lower dielectric film 219 may be formed of a strontium-titanium oxide (SrTiO$_3$) film.

An intermediate dielectric film 221 may be interposed between the lower dielectric film 219 and the upper dielectric film 223. The lower dielectric film 219 and the upper dielectric film 223 may be formed as crystalline or amorphous dielectric films, and the intermediate dielectric film 221 may be formed as a crystalline or amorphous dielectric film. For example, the lower dielectric film 219 may be formed of at least one of a HfO$_2$ film, a ZrO$_2$ film, a Al$_2$O$_3$ film, and/or a La$_2$O$_3$ film, each having a crystalline or amorphous structure, and the intermediate dielectric film 221 may be formed of a strontium-titanium oxide (SrTiO$_3$) film.

In some example embodiments, the intermediate dielectric film 221 may be formed of at least one of an HfO$_2$ film, a ZrO$_2$ film, an Al$_2$O$_3$ film, a La$_2$O$_3$ film, a Ta$_2$O$_5$ film, a doped TiO film, and/or a STO film, each having a crystalline or amorphous structure. For example, the intermediate dielectric film 221 may be formed of a strontium-titanium oxide (SrTiO$_3$) film. Further, the intermediate dielectric film 221 may be formed of at least one of a Ta$_2$O$_5$ film, a TiO film, a doped TiO film, and/or a STO film, each having a crystalline or amorphous structure. As described above, the intermediate dielectric film 221 is forms as a dielectric film having a crystalline or amorphous structure, and thus breakdown voltage characteristics of the dielectric film 224 may be improved. For example, when the lower dielectric film 219 and the upper dielectric film 223 are formed as dielectric films each having a crystalline structure, breakdown voltages of the lower dielectric film 219 and the upper dielectric film 223 may be improved, but leakage current characteristics may be deteriorated. Accordingly, the intermediate dielectric film 221, which is a dielectric film having an amorphous structure, is formed between the lower dielectric film 219 and the upper dielectric film 223, and thus a capacitor having excellent electrical characteristics, such as leakage current characteristics and breakdown voltage characteristics, may be provided.

An interlayer (not shown) is formed between a front surface of the semiconductor substrate 201 having the lower electrode 217' and the dielectric film 224 in which the lower dielectric film 219, the intermediate dielectric film 221, and the upper dielectric film 223 are sequentially stacked and/or between the lower electrode 217' and the dielectric film 224.

By additionally including the interlayer (not shown), the MIM capacitor may have further improved leakage current characteristics.

The MIM capacitor shown in FIG. 6 may have a concave structure, pillar, and/or a cylinder structure.

An electronic device according to some example embodiments includes the capacitor described above. The electronic device has the capacitor including the interlayer, and thus has reduced leakage current and provides excellent device characteristics.

The electronic device may be, for example, a semiconductor device. The electronic device may be, for example, a memory device. The memory device may be, for example, dynamic random access memory (DRAM), a flash memory, or the like.

Figure 7:
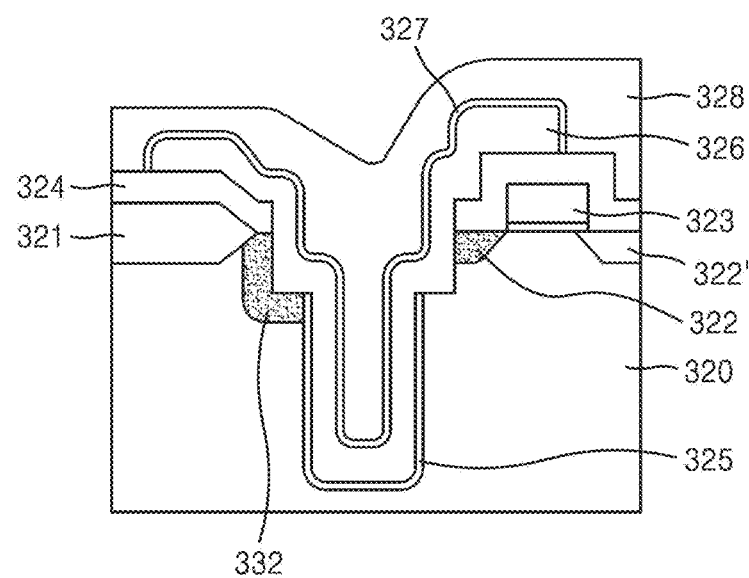
FIG. 7 shows a structure of a trench capacitor-type dynamic random-access memory (DRAM) according to some example embodiments.

FIG. 7 shows a structure of a trench capacitor type dynamic random access memory (trench capacitor type DRAM) according to some example embodiments.

Referring to FIG. 7, a device isolation region is formed with a field oxide film 321 on a P-type semiconductor substrate 320. A gate electrode 323 and source/drain impurity regions 322 and 322' are formed in the device isolation region. A high-temperature oxide (HTO) film is formed as an interlayer insulating film 324. A portion where a trench is not to be formed is capped with a trench buffer layer, and then, a portion of the source region 322 is opened to form a contact portion.

A trench is formed on the sidewall of the interlayer insulating film 324, and a sidewall oxide film 325 is formed on the entire sidewall of the trench. The sidewall oxide film 325 may compensate for damage occurred in the semiconductor substrate during etching for forming the trench, and also serve as a dielectric film between the silicon substrate and a storage electrode to be formed later. In the source region 322 formed on the trench sidewall, the entire sidewall S of the source region is exposed, except for a portion of the source region 322 on the gate side.

A PN junction 332 is formed on a sidewall portion S of the source region 322, e.g., by impurity injection, the source region 322 is formed at the left side of the gate electrode, and the drain region 322' is formed at the right side of the gate electrode. A trench is formed in the source region 322, the gate side of the sidewall of the trench T is in direct contact with the source region 322, and impurities are additionally injected into the source region 322 to form the PN junction 332 on the other side.

A polysilicon layer is formed as a storage electrode 326 on a part of the interlayer insulating film 324, the exposed source region, and the surface of the sidewall oxide film 325 in the trench. The storage electrode 326 is formed to contact not only the source region 322 on the side of the gate electrode 323, but also the entire source region 322 in contact with the circumference of the upper wall of the trench. Further, the source region 322 formed around the upper sidewall of the trench is enlarged due to the injected impurities, and thus the source region more securely contacts the storage electrode 326. Then, a dielectric insulating film 327 is formed with the dielectric of a capacitor along the upper surface of the storage electrode 326, and a polysilicon layer, as a plate electrode 328, is formed on the insulating film 327, thereby completing a trench capacitor type DRAM.

In the trench capacitor type DRAM, the interlayer (not shown) described above is additionally disposed between the storage electrode 326 and the dielectric insulating film 327.

A method of manufacturing the capacitor, according to some example embodiments, includes: providing a first thin film electrode layer (or a second thin film electrode layer); arranging an interlayer on one surface of the first thin film electrode layer (or the second thin film electrode layer), by epitaxial growth; arranging a dielectric layer on the interlayer; and arranging another thin film electrode layer on the dielectric layer to provide the capacitor, wherein the capacitor includes: a first thin film electrode layer; a second thin film electrode layer; a dielectric layer arranged between the first thin film electrode layer and the second thin film electrode layer; and an interlayer arranged between the dielectric and at least one of the first thin film electrode layer or the second thin film electrode layer. The interlayer on the first thin film electrode layer (or the second thin film electrode layer) may, due at least in part to the epitaxial growth, have the same type of a crystal structure as (even with a different composition from) the first thin film electrode layer (or the second thin film electrode layer). The interlayer may include a first anionized layer, a second anionized layer, and/or a first neutral layer, the first anionized layer includes a monovalent cation, a divalent cation, or a trivalent cation that has an atomic weight of 20 or more, the second anionized layer includes a monovalent cation, and the first neutral layer includes a plurality of trivalent cations, as discussed above. The dielectric layer may include a ternary oxide having a perovskite-type crystal structure. The capacitor manufactured by the method as described above includes the interlayer, and thus, the leakage current may be reduced.

For example, the method of manufacturing a capacitor, as in FIGS. 5A to 5E, may include first, providing a first thin film electrode 11 (or a second thin film electrode 13).

In some example embodiment, the first thin film electrode 11 (and/or the second thin film electrode 13) may each include at least one of strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide (($Ba,Sr$)$RuO_3$), iridium (Ir), an iridium-ruthenium (IrRu) alloy, iridium oxide ($IrO_2$), titanium-aluminum nitride (TiAlN), titanium oxide ($TiO_2$), ruthenium (Ru), platinum (Pt), zirconium oxide ($ZrO_2$), tin oxide ($SnO_2$), indium-tin oxide (ITO), and/or the like. However, embodiments are not limited thereto. For example, another electrode material available in the art may be used. These materials may be used alone or in combination with each other.

At least one of the first thin film electrode 11 and/or the second thin film electrode 13 may be an oxide having a perovskite-type structure. For example, at least one of the first thin film electrode 11 and/or the second thin film electrode 13 may include at least one of strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), and/or barium-strontium-ruthenium oxide (($Ba,Sr$)$RuO_3$).

The first electrode 11 and/or the second electrode 13 may be formed by depositing a metal, a metal oxide, a metal nitride, a metal oxynitride, or a metal alloy through an electron-beam epitaxy process, a liquid epitaxy process, a vapor epitaxy process, a chemical vapor deposition process, a sputtering process, an atomic layer deposition process, a pulsed laser deposition process, and/or the like. The first electrode 11 and the second electrode 13 each have a single-layer structure and/or a multi-layer structure.

In some example embodiments, the first electrode 11 (and/or the second electrode 13 may be formed by heat-treating a coating film obtained by coating and drying an electrode paste including a conductive material.

The coating method does not use a vacuum process or a high-temperature process, and thus it is possible to simply manufacture the first electrode 11 or the second electrode 13.

The electrode paste may include conductive material particles, an organic component, and a solvent.

The conductive material may be any conductive material that can be used in general for electrodes. Examples of the conductive material include: conductive metal oxides such as tin oxide, indium oxide, and indium-tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon, and polysilicon, or alloys thereof; inorganic conductive materials such as copper iodide, copper sulfide, or the like; conductive polymers, such as polythiophene, polypyrrole, polyaniline, polyethylenedioxythiophene, and polystyrene sulfonic acid, of which the conductivity is improved by doping with complex, iodine and the like; and carbon materials. Although the conductive material may be used alone, a plurality of conductive materials may be used in combination by laminating or mixing.

The conductive material is, for example, metal particles. By using metal particles, the bending resistance of the capacitor is improved, and/or a coercive electric field does not increase even when voltages are repeatedly applied. Thus, uneven portions are formed on the surface of the conductive film, and the dielectric layer is disposed on the uneven portions to exhibit an anchor effect, thereby improving the contact between the electrode and the dielectric layer. For example, the metal particles may include at least one selected from gold, silver, copper, platinum, lead, tin, nickel, aluminum, tungsten, molybdenum, ruthenium oxide, chromium, titanium, carbon, and indium.

The organic component and the solvent that are used in the electrode paste may be the same as those used in the dielectric layer.

Next, the interlayer (not shown) is arranged on one surface of the first thin film electrode 11 or the second thin film electrode 13 by epitaxial growth.

The interlayer may include the first anionized layer, may include the second anionized layer, or may include the first neutral layer, as described above.

For example, the epitaxial growth may be performed using a molecular beam epitaxy process, a liquid phase epitaxy process, a vapor phrase epitaxy process, and/or the like.

When the interlayer (not shown) is formed using a molecular beam epitaxy process, for example, after an insulating substrate 100 on which the first thin electrode 11 that is surface-treated is formed is loaded into a reaction chamber, the first thin film electrode 11 may be maintained at a temperature of about 400° C. to about 800° C., and a partial pressure of an oxidant, for example, an oxygen partial pressure may be maintained at about $10^{-8}$ Torr to about $10^{-5}$ Torr in the chamber. A metal for forming the interlayer may be supplied by sublimating the metal from a metal precursor. Subsequently, a gaseous metal is provided onto the surface-treated first electrode 11, and then an oxidant may be supplied to form the interlayer (not shown) on the surface-treated first thin film electrode 11. When the interlayer (not shown) includes a $[GaO_2]^-$ layer, and the metal precursor consists of gallium (and/or a gallium-containing first precursor compound), the oxidant may include oxygen ($O_2$), ozone ($O_3$), nitrogen dioxide ($NO_2$), and/or dinitrogen oxide ($N_2O$). The oxidant may be, for example, oxygen.

Next, on the interlayer (not shown) the dielectric layer 12 may be arranged.

For example, the dielectric layer 12 may include at least one of strontium-titanium oxide ($SrTiO_3$), lithium-niobium oxide ($LiNbO_3$,), potassium-niobium oxide ($KNbO_3$), potassium-thallium oxide ($KTaO_3$), barium-titanium oxide ($BaTiO_3$), calcium-titanium oxide ($CaTiO_3$), lead-titanium oxide ($PbTiO_3$), sodium-niobium oxide ($NaNbO_3$), sodium-thallium oxide ($NaTaO_3$), calcium-zirconium oxide ($CaZrO_3$), barium-zirconium oxide ($BaZrO_3$), strontium-zirconium oxide ($SrZrO_3$), and/or the like.

The dielectric layer 12 may be an oxide having a perovskite-type structure. For example, the dielectric layer 12 may be strontium-titanium oxide ($SrTiO_3$).

The dielectric layer 12 may be formed using, for example, a chemical vapor deposition process, an organometallic chemical vapor deposition process, a molecular beam epitaxy process, a vapor phase epitaxy process, a liquid phase epitaxy process, a sol-gel process, a sputtering process, a pulsed laser deposition process, an atomic layer deposition process, or the like.

When the dielectric layer 12 is formed using a molecular beam epitaxy process, for example, after an insulating substrate 100 on which the first thin electrode 11 that is surface-treated is formed is loaded into a reaction chamber, the first thin film electrode 11 may be maintained at a temperature of about 400° C. to about 800° C., and a partial pressure of an oxidant, for example, an oxygen partial pressure may be maintained at about $10^{-8}$ Torr to about $10^{-5}$ Torr in the chamber. A gaseous metal for forming an interlayer may be supplied by sublimating the metal from a metal precursor. Subsequently, a gaseous metal is provided onto the surface-treated first electrode 11, and then an oxidant may be supplied to form the interlayer (not shown) on the surface-treated first thin film electrode 11.

For example, when the dielectric layer 12 includes a $SrTiO_3$ layer, a first metal precursor may consist of strontium and/or a strontium-containing first precursor compound and titanium or a titanium-containing second precursor compound, and the oxidant may include oxygen ($O_2$), ozone ($O_3$), nitrogen dioxide ($NO_2$), or dinitrogen oxide ($N_2O$). The oxidant may be, for example, oxygen.

When the dielectric layer 12 is formed using a chemical vapor deposition process, an insulating substrate 100 on which a first electrode 11 that is surface-treated is formed may be loaded in a reaction chamber, and the reaction chamber may be maintained at a temperature of about 500° C. to about 600° C. and a pressure of about 1 Torr and about 10 Torr.

Subsequently, an organic metal precursor is provided onto the surface-treated first electrode 11, and then an oxidant is supplied to form the electric layer 12 on the surface-treated first electrode 11. When the dielectric layer 12 includes a $SrTiO_3$ layer, the organic metal precursor may consist of strontium or a strontium-containing first precursor compound and titanium or a titanium-containing second precursor compound, and the oxidant may include oxygen ($O_2$), ozone ($O_3$), nitrogen dioxide ($NO_2$), dinitrogen oxide ($N_2O$), and/or the like.

The materials constituting the dielectric layer 12 may be additionally crystalized by performing a heat treatment process on the dielectric layer 12. For example, the dielectric layer 12 is heat-treated by a rapid heat treatment process (RTP) under an atmosphere of oxygen ($O_2$) gas, nitrogen ($N_2$) gas, argon (Ar) gas, ammonia ($NH_4$) gas, or a mixture thereof. The rapid heat treatment process is performed at a temperature of about 500° C. to about 650° C. for about 30 seconds to about 3 minutes.

In some example embodiments, the dielectric layer 12 may be formed by heat-treating a coating film obtained by coating and drying a dielectric paste including the dielectric described above.

The coating method does not use a vacuum process or a high-temperature process, and thus it is possible to simply manufacture the dielectric layer 12.

The dielectric paste includes the dielectric described above, an organic component, and a solvent. The dielectric paste includes dielectric particles. The organic component is embedded in the voids between the dielectric particles to prevent a short circuit of a capacitor and improve the production yield of the capacitor.

Examples of the organic component include a monomer, an oligomer, a polymer, a photopolymerization initiator, a plasticizer, a leveling agent, a surfactant, a silane coupling agent, a defoamer, a pigment, and/or a dispersant. In view of improving the bending resistance of the capacitor, for example, the organic component may be an oligomer or a polymer. The oligomer or polymer may be, for example, a thermoplastic resin, a thermosetting resin, or the like. Examples of the oligomer or polymer include acrylic resin, epoxy resin, novolak resin, phenol resin, polyimide precursor resin, polyimide resin, polysiloxane resin, fluorine resin, polyvinyl acetal resin, and/or the like.

Any solvent may be used as long as it disperses the dielectric particles and dissolves the organic component. Examples of the solvent may include organic solvents, including: ketone-based solvents such as methyl ethyl ketone, acetone, diethyl ketone, methyl isobutyl ketone, methyl isopropyl ketone, cyclopentanone, and cyclohexanone; alcohol-based solvents such as methanol, ethanol, isopropanol, isobutyl alcohol, benzyl alcohol, methoxymethylbutanol, ethylene glycol, diethylene glycol, and glycerin; ether-based solvents such as diethyl ether, diisopropyl ether, 1,2-dimethoxyethane, 1,4-dioxane, tetrahydrofuran, tetrahydropyran, anisole, diethylene glycol dimethyl ether (diglyme), and diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound solvents such as pyridine, pyrazine, furan, pyrrole, thiophene, and N-methylpyrrolidone; amide-based solvents such as N, N-dimethylformamide and N, N-dimethylacetamide; halogen compound-based solvents such as trichloroethylene, dichloromethane, chloroform, 1,2-dichloroethane, and chlorobenzene; ester-based solvents such as ethyl acetate, methyl acetate, ethyl formate, ethyl lactate, dimethyl carbonate, diethyl carbonate, propylene carbonate, and γ-butyrolactone; sulfur compound-based solvents such as dimethyl sulfoxide and sulfolane; nitrile-based solvents such as acetonitrile, propionitrile, and acrylonitrile; organic acid-based solvents such as formic acid, acetic acid, trichloroacetic acid, and trifluoroacetic acid; and mixed solvents thereof.

Examples of the coating method include spin coating, blade coating, slit die coating, screen printing, bar coating, casting, gravure printing, flexographic printing, offset printing, dip coating, inkjet printing, and dispensing. Among these coating methods, in view of pattern workability and film formability, for example, screen printing, gravure printing, flexographic printing, offset printing, inkjet printing, dispensing, or the like may be used.

A method of removing a solvent from a coating film may be, for example, heat drying or vacuum drying using an oven, a hot plate, or infrared light, and, for example, may be performed at a temperature of about 50° C. to about 140° C. for about 1 minute to about several hours.

Next, in order to improve dielectric characteristics, the coating film may be cured. The curing temperature is selected depending on the kind of a dielectric compound, a solvent used, and the kind of a substrate. For example, when the organic component in the dielectric paste is an acrylic resin, from the viewpoint of heat resistance, the curing temperature is in a range of about 50° C. to about 300° C. Further, when the insulating substrate is polyethylene terephthalate, in view of preventing deterioration in processing accuracy due to thermal expansion of the substrate, the curing temperature may be kept within a range of about 50° C. to about 150° C. As the curing method, heat curing or vacuum curing using an oven, a hot plate or infrared light, curing using a xenon flash lamp, and photocuring using UV light may be used.

In order to increase the flatness of the dielectric layer, it is possible to form a planarization layer on the coating film obtained by coating and drying the dielectric paste. The material of the planarization layer may be a known resin such as a polyimide resin, a polysiloxane resin, an acrylic resin, and/or an epoxy resin. For example, in view of dielectric characteristics, the thickness of the planarization layer may be smaller than the thickness of the dielectric layer.

The dielectric layer may be patterned or not patterned. In view of preventing misreading by reducing crosstalk between dielectric elements, the dielectric layer may be patterned. As the patterning method, for example, in view of fine processing, photolithography processing in which the organic component includes a photosensitive organic component may be used. When the photolithography processing is used, it may be possible to highly integrate dielectric elements.

Next, the other thin film electrode layer is arranged on the dielectric layer 12 to provide the capacitor 20.

A method of arranging another thin film electrode layer may be the same as the method of arranging the first thin film electrode 11 or the second thin film electrode 13.

When the first thin film electrode 11 is arranged first, the second thin film electrode 13 is arranged on the dielectric layer 12. When the second thin film electrode 13 is arranged first, the first thin film electrode 11 is arranged on the dielectric layer 12.

By the arrangement of the second thin film electrode 13 or the first thin film electrode 11 on the dielectric layer 12, the capacitor 20 is prepared.

Figure 8:
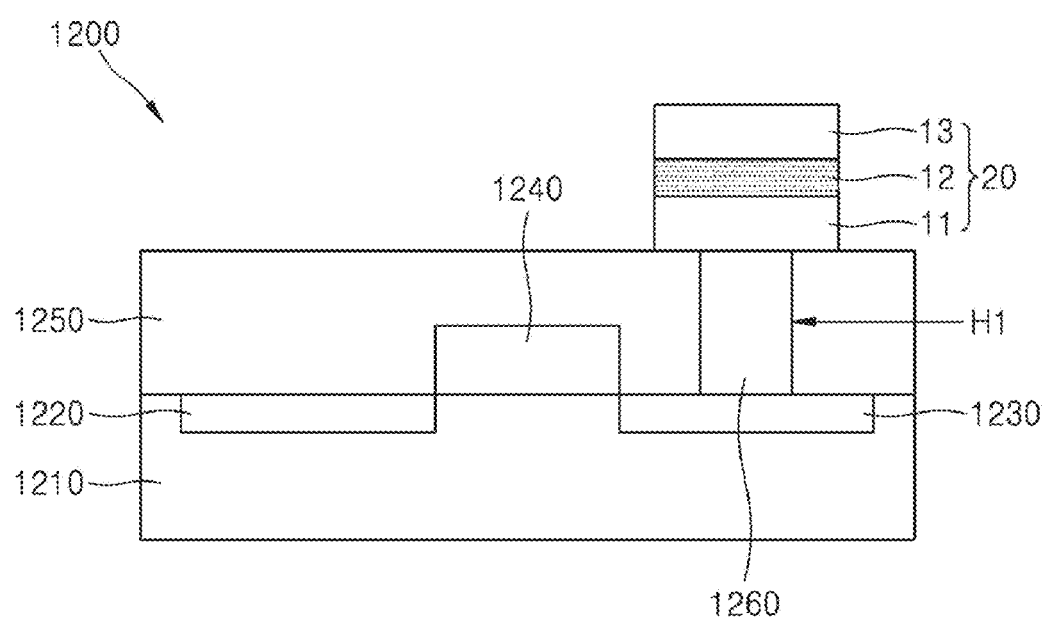
FIG. 8 is a cross-sectional view illustrating an electronic device having a layer structure including a dielectric layer according to some example embodiments, and showing a memory device.

FIG. 8 shows a memory device 1200 including a layer structure according to some example embodiments. The memory device 1200 may be, e.g., a nonvolatile ferroelectric memory device (e.g., FRAM).

Referring to FIG. 8, the memory device 1200 may include a substrate 1210, first and second doped regions 1220 and 1230 formed in the substrate 1210, a gate stack 1240, a conductive plug 1260, and data storage element 1270, and an interlayer insulating layer 1250. The substrate 1210 may include a semiconductor substrate. The first and second doped regions 1220 and 1230 are separated from each other. The first and second doped regions 1220 and 1230 may be formed by doping a P-type or N-type conductive impurity in predetermined (or otherwise determined) regions of the substrate 1210. The type of the conductive impurity doped in the first and second doped regions 1220 and 1230 may be opposite to the type of conductive impurity doped in the substrate 1210. For example, when the substrate 1210 is a P-type semiconductor substrate, the first and second doped regions 1220 and 1230 may be regions doped with an N-type conductive impurity. One of the first and second doped regions 1220 and 1230 may be a source region, and the other may be a drain region.

The gate stack 1240 is formed on the substrate 1210 between the first doped region 1220 and the second doped region 1230. The gate stack 1240 may include a gate insulating layer and a gate electrode sequentially stacked. The gate stack 1240 and the first and second doped regions 1220 and 1230 may form a transistor.

The interlayer insulating layer 1250 is formed to cover the transistor. An upper surface of the interlayer insulating layer 1250 may be flat. In one example, the interlayer insulating layer 1250 may include a silicon oxide layer, but is not limited thereto. A via hole H1 through which the second doped region 1230 is exposed is formed in the interlayer insulating layer 1250. The via hole H1 may be located on the second doped region 1230. The conductive plug 1260 may be included in the via hole H1. For example, the via hole H1 may be completely filled with the conductive plug 1260. One surface (e.g., a bottom surface) of the conductive plug 1260 is in direct contact with the second doped region 1230.

A capacitor 20, configured as a data storage element, may be provided on the interlayer insulating layer 1250 and to cover the via hole H1 and the conductive plug 1260. The capacitor 20 may be in direct contact with the conductive plug 1260. The data storage element 1270 may include a lower electrode 11, a dielectric layer 12, and an upper electrode 13. The capacitor 20, including the sequentially stacked lower electrode 11, the dielectric layer, and the upper electrode 13, may be, respectively, the capacitor 20, first thin film electrode 11, the dielectric layer 12, and the second thin film electrode 13 of FIGS. 5A to 5D. In some example embodiments, the gate insulating layer may include the dielectric layer 12.

However, the memory device 1200 is not limited thereto. For example, in some embodiments, the capacitor 20 may be directly connected to the transistor and/or the capacitor 20 and the transistor may share a doped region (e.g., the second doped region 1230)

FIG. 8 schematically illustrates an example memory device 1200. However, as shown in FIG. 9, a semiconductor apparatus D10 may have a structure in which a plurality of capacitors 1' and a plurality of field effect transistors are repeatedly arranged.

Figure 9:
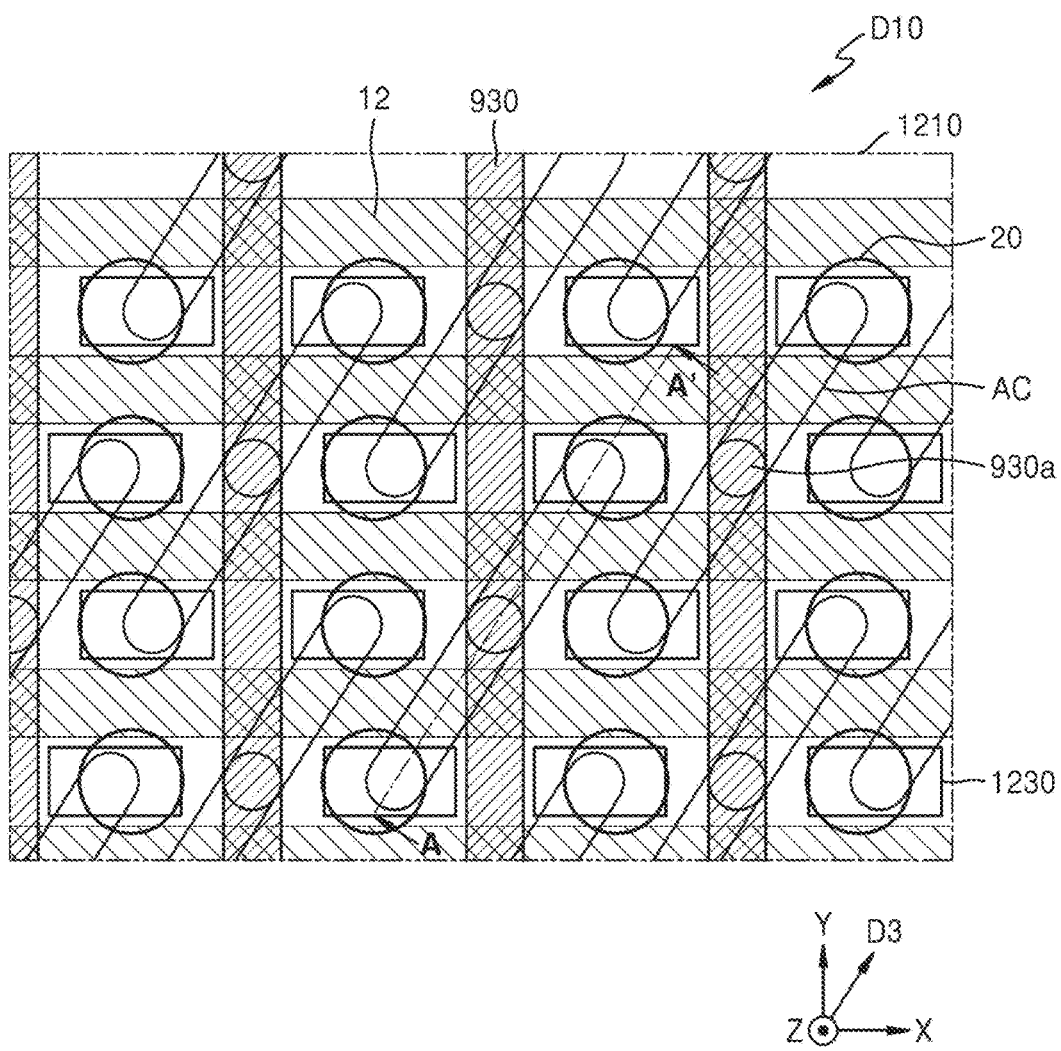
FIG. 9 is a layout view illustrating a semiconductor apparatus according to some example embodiments.

Referring to FIG. 9, the semiconductor apparatus D10 may include the field effect transistors including gate stacks 1240 and a substrate 1210, which has sources, drains, and channels; contact structures 1230 arranged on the substrate 1210 without overlapping the gate stacks 1240; and the capacitors 20 arranged on the contact structures 1230. The semiconductor apparatus D10 may further include bit line structures 930, which electrically connect the field effect transistors to each other. FIG. 9 illustrates the semiconductor apparatus D10 in which the contact structures 1230 and the capacitors 20 are repeatedly arranged in X and Y directions, but this is a non-limiting example. For example, the contact structures 1230 may be arranged in the X and Y directions, and the capacitors 20 may be arranged in a hexagonal shape such as a honeycomb structure.

Figure 10:
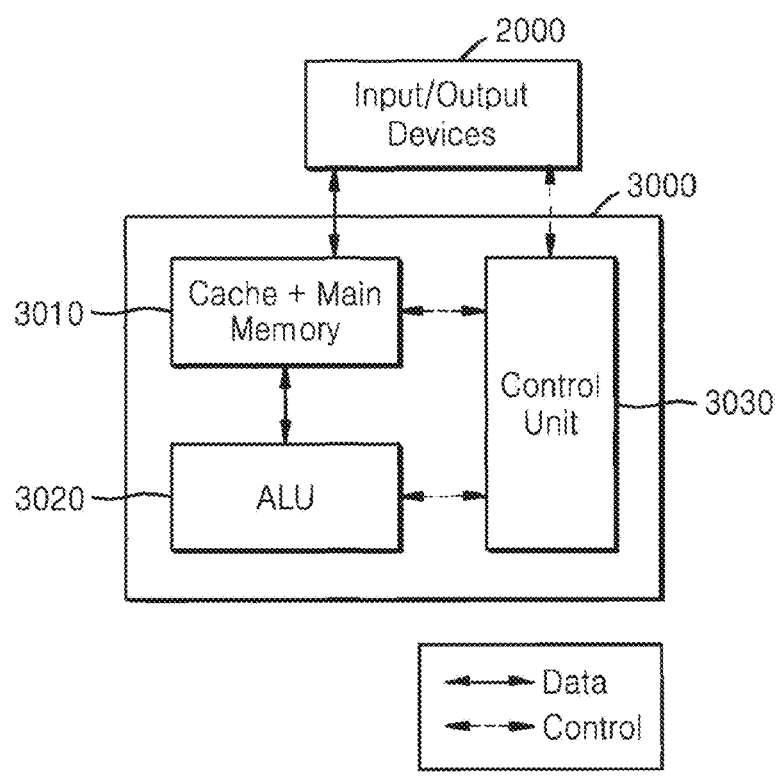
FIGS. 10 and 11 are conceptual views schematically illustrating device architectures applicable to electronic devices according to some example embodiments.
Figure 11:
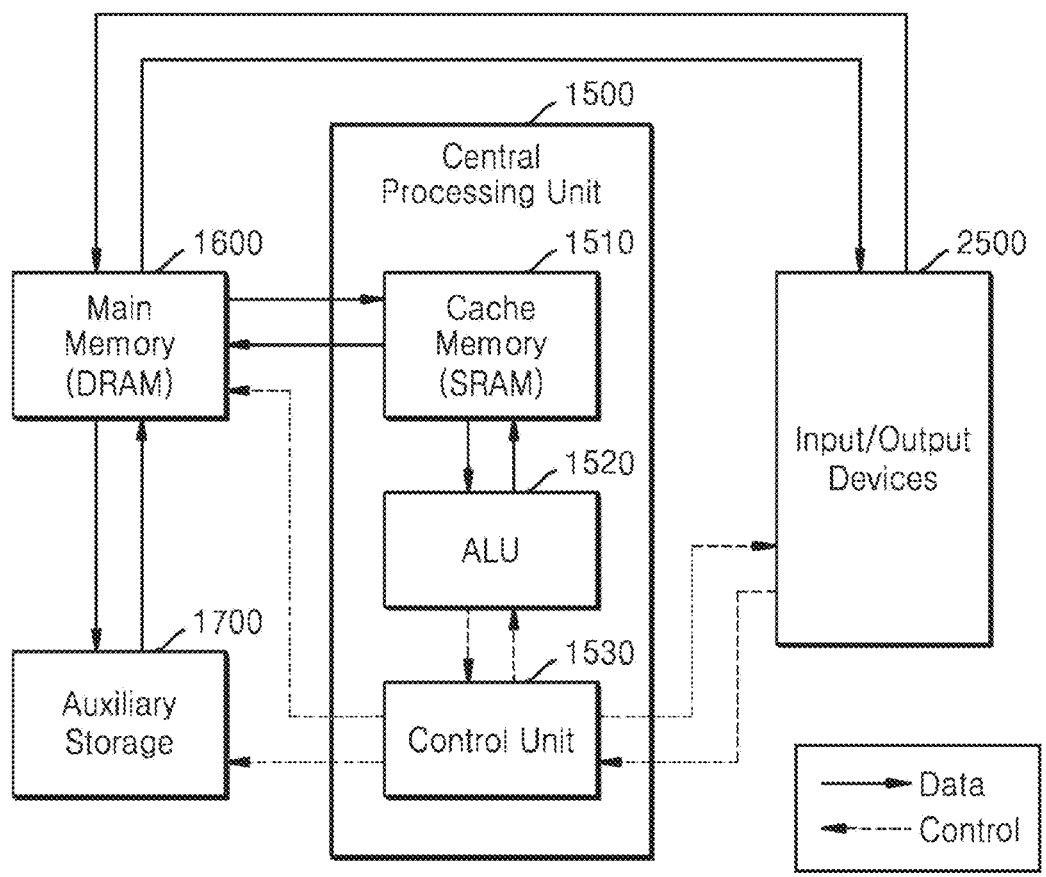

FIGS. 10 and 11 are conceptual views schematically illustrating electronic device architectures applicable to electronic devices according to embodiments.

Referring to FIG. 11, an electronic device architecture 3000 may include a memory unit 3010, an arithmetic logic unit (ALU) 3020, and a control unit 3030. The memory unit 3010, the ALU 3020, and the control unit 3030 may be electrically connected to each other. For example, the electronic device architecture 3000 may be implemented as a single chip including the memory unit 3010, the ALU 3020, and/or the control unit 3030. For example, the memory unit 3010, the ALU 3020, and the control unit 3030 may be connected to each other through metal lines on a chip for direct communication therebetween. The memory unit 3010, the ALU 3020, and/or the control unit 3030 may be monolithically integrated on a single substrate to form a single chip. Input/output devices 2000 may be connected to the electronic device architecture (chip) 3000. The control unit 3030 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. Similarly, though the electronic device architecture 3000 is illustrated as including the ALU 3020, the electronic device architecture 3000 is not limited, and may contain additional and/or alternative processing circuitry. The memory unit 3010 may include a main memory and a cache memory. The electronic device architecture (chip) 3000 may be an on-chip memory processing unit.

The memory unit 3010, the ALU 3020, and/or the control unit 3030 may each independently include the above-described layer structures. Referring to FIG. 12, a cache memory 1510, an ALU 1520, and a control unit 1530 may form a central processing unit (CPU) 1500, and the cache memory 1510 may include a static random access memory (SRAM). A main memory 1600 and an auxiliary storage 1700 may be provided apart from the CPU 1500. The main memory 1600 may include a dynamic random access memory (DRAM) including layer structures such as those described above.

In some cases, an electronic device architecture may be implemented in a form in which unit computing devices and unit memory devices are adjacent to each other on a single chip without sub-units.

Hereinafter, the present disclosure will be described in more detail with reference the following examples and comparative examples. However, these examples are only for illustrative purposes and are not intended to limit the scope of the present disclosure.

(Manufacture of Capacitor)

Example 1: $[GaO_2]^-$ First Anionized Layer, 1 Unit Cell

On a (001) plane of a $SrRuO_3$ first thin film electrode having a thickness of 100 angstrom (Å), a $[GaO_2]^-$ first anionized layer and a [SrO] second neutral layer were sequentially grown in the [001] direction to form an interlayer.

The interlayer is represented by $SrGaO_x$ (wherein $2.5<x\leq3.0$) as a compound. The interlayer including 1 unit cell had a thickness of 4.0 Å. Molecular beam epitaxy was performed at an oxygen partial pressure of $5\times10^{-8}$ to $8\times10^{-8}$ Torr, and the temperature of the first thin film electrode was 700° C.

A $SrTiO_3$ dielectric layer was grown on the $SrGaO_x$ interlayer to a thickness of 100 Å by the same method.

A $SrRuO_3$ second thin film electrode having a thickness of 200 Å was formed on the $SrTiO_3$ dielectric layer by the same method, to thereby manufacture a capacitor.

Example 2: $[InO_2]^-$ First Anionized Layer, 1 Unit Cell

A capacitor was manufactured in the same manner as in Example 1, except that a $[InO_2]^-$ anionized layer was formed instead of the $[GaO_2]^-$ anionized layer.

Example 3: $[BeO_2]^{-2}$ First Anionized Layer, 1 Unit Cell

A capacitor was manufactured in the same manner as in Example 1, except that a $[BeO_2]^{-2}$ anionized layer was formed instead of the $[GaO_2]^-$ anionized layer.

Example 4: $[MgO_2]^{-2}$ First Anionized Layer, 1 Unit Cell

A capacitor was manufactured in the same manner as in Example 1, except that a $[MgO_2]^{-2}$ anionized layer was formed instead of the $[GaO_2]^-$ anionized layer.

Example 5: $[LiO_2]^{-3}$ First Anionized Layer, 1 Unit Cell

A capacitor was manufactured in the same manner as in Example 1, except that a $[LiO_2]^{-3}$ anionized layer was formed instead of the $[GaO_2]^-$ anionized layer.

Example 6: $[LiO]^-$ Second Anionized Layer, 1 Unit Cell

On a (001) plane of a $SrRuO_3$ first thin film electrode having a thickness of 100 Å, a $[LiO]^-$ second anionized layer and a [TiO$_2$] third neutral layer were sequentially grown in the [001] direction to form an interlayer.

The interlayer is represented by LiTiO$_x$ (wherein 2.5<x≤3.0) as a compound. The interlayer including 1 unit cell had a thickness of 4.0 Å. Molecular beam epitaxy was performed at an oxygen partial pressure of 5×10$^{-8}$ to 8×10$^{-8}$ Torr, and the temperature of the first thin film electrode was 700° C.

A SrTiO$_3$ dielectric layer was grown on the LiTiO$_x$ interlayer to a thickness of 100 Å by the same method.

A SrRuO$_3$ second thin film electrode having a thickness of 100 Å was formed on the SrTiO$_3$ dielectric layer by the same method, to thereby manufacture a capacitor.

Example 7: [NaO]$^-$ Second Anionized Layer, 1 Unit Cell

A capacitor was manufactured in the same manner as in Example 6, except that a [NiO]$^-$ anionized layer was formed instead of the [LiO]$^-$ anionized layer.

Example 8: [KO]$^-$ Second Anionized Layer, 1 Unit Cell

A capacitor was manufactured in the same manner as in Example 6, except that a [KO]$^-$ anionized layer was formed instead of the [LiO]$^-$ anionized layer.

Example 9: [RbO]$^-$ Second Anionized Layer, 1 Unit Cell

A capacitor was manufactured in the same manner as in Example 6, except that a [RbO]$^-$ anionized layer was formed instead of the [LiO]$^-$ anionized layer.

Example 10: [ScO]$^+$ First Cationized Layer and [GaO$_2$]$^-$ Third Anionized Layer, 1 Unit Cell On a (001) plane of a SrRuO$_3$ first thin film electrode having a thickness of 100 Å, a [ScO]$^+$ first cationized layer and a [GaO$_2$]$^-$ third neutral layer were sequentially grown in the [001] direction to form an interlayer.

The interlayer is represented by ScGaO$_3$ as a perovskite compound. The interlayer including 1 unit cell had a thickness of 4.0 Å. Molecular beam epitaxy was performed at an oxygen partial pressure of 5×10$^{-8}$ to 8×10$^{-8}$ Torr, and the temperature of the first thin film electrode was 700° C.

A SrTiO$_3$ dielectric layer was grown on the SrGaO$_3$ interlayer to a thickness of 100 Å by the same method.

A SrRuO$_3$ second thin film electrode having a thickness of 100 Å was formed on the SrTiO$_3$ dielectric layer by the same method, to thereby manufacture a capacitor.

Example 11: [LaO]$^+$ First Cationized Layer and [AlO$_2$]$^-$ Third Anionized Layer, 1 Unit Cell On a (001) plane of a SrRuO$_3$ first thin film electrode having a thickness of 100 Å, a [LaO]$^+$ first cationized layer and a [AlO$_2$]$^-$ third anionized layer were sequentially grown in the [001] direction to form an interlayer.

The interlayer is represented by LaAlO$_3$ as a perovskite compound. The interlayer including 1 unit cell had a thickness of 4.0 Å. Molecular beam epitaxy was performed at an oxygen partial pressure of 5×10$^{-8}$ to 8×10$^{-8}$ Torr, and the temperature of the first thin film electrode was 700° C.

A SrTiO$_3$ dielectric layer was grown on the LaAlO$_3$ interlayer to a thickness of 100 Å by the same method. A SrRuO$_3$ second thin film electrode having a thickness of 100 Å was formed on the SrTiO$_3$ dielectric layer by the same method, to thereby manufacture a capacitor.

Example 12: [GaO$_2$]$^-$ First Anionized Layer, 2 Unit Cells

A capacitor was manufactured in the same manner as in Example 1, except that the thickness of the SrGaO$_x$ interlayer was changed to 2 unit cells.

Comparative Example 1: [LaO]$^+$ First Cationized Layer, 1 Unit Cell

On a (001) plane of a SrRuO$_3$ first thin film electrode having a thickness of 100 Å, a [LaO]$^+$ first cationized layer and a [TiO$_2$] third neutral layer were sequentially grown in the [001] direction to form an interlayer.

The interlayer is represented by LaTiO$_x$ (wherein 2.5<x≤3.0) as a composition. The interlayer including 1 unit cell had a thickness of 4.0 Å. Molecular beam epitaxy was performed at an oxygen partial pressure of 5×10$^{-8}$ to 8×10$^{-8}$ Torr, and the temperature of the first thin film electrode was 700° C.

A SrTiO$_3$ dielectric layer was grown on the LaTiO$_x$ interlayer to a thickness of 100 Å by the same method.

A SrRuO$_3$ second thin film electrode having a thickness of 100 Å was formed on the SrTiO$_3$ dielectric layer by the same method, to thereby manufacture a capacitor.

Comparative Example 2: [YO]$^+$ First Cationized Layer, 1 Unit Cell

A capacitor was manufactured in the same manner as in Comparative Example 1, except that a [YO]$^+$ cationized layer was formed instead of the [LaO]$^+$ cationized layer.

Comparative Example 3: [YO]$^+$ First Cationized Layer, 2 Unit Cells

A capacitor was manufactured in the same manner as in Comparative Example 2, except that the thickness of the interlayer was increased to 2 unit cells.

Comparative Example 4: Interlayer-Free, 1 Unit Cell

A capacitor was manufactured in the same manner as in Example 1, except that the step of introducing the interlayer was omitted.

(Evaluation Example 1: Schottky Barrier Height (SBH) Calculation when First Anionized Layer was Included)

An amount of change (ΔV) of the Schottky barrier height (SBH) of a laminate, in which a first anionized layer is disposed as the interlayer between SrRuO$_3$ and SrTiO$_3$, with respect to a laminate of SrRuO$_3$ (electrode)/SrTiO$_3$ (dielectric) was calculated, and some of the results are shown in Table 1.

Referring to FIGS. 1A and 1B, the first aniodized layer is arranged as the interlayer between SrRuO$_3$ and SrTiO$_3$. The metal cation included in the interlayer is located at an octahedral site coordinated with 6 oxygen atoms in the perovskite structure, and corresponds to B in the composition of ABO$_3$.

A dielectric constant and a bandgap were calculated in the framework of the density functional theory (DFT) using the Vienna Ab initio simulation package (VASP).

The Schottky barrier height (SBH) of a laminate with the interlayer arranged therein is represented by Equation 1. The Goldschmidt tolerance factor (t) is a parameter indicating the stability of a cubic perovskite structure. The closer to 1 indicates higher stability of the cubic perovskite structure. The Goldschmidt tolerance factor (t) is represented by Expression 2.

$$SBH = \Phi - \chi + \Delta V \quad \text{<Equation 1>}$$

In Equation 1, $\Phi$ is the work function of the electrode, $\chi$ is the electron affinity of the dielectric, and $\Delta V$ is the amount of change in SBH.

$$t = \frac{r_A + r_O}{\sqrt{2}(r_B + r_O)} \quad \text{<Equation 2>}$$

In Equation 2, $r_A$ is the ionic radium of A ion, $r_B$ is the ionic radius of B ion, $r_O$ is the ionic radius of oxygen, and t is the Goldschmidt tolerance factor.

TABLE 11

| Interlayer | Cation of Interlayer | Amount of change in SBH [eV] | Goldschmidt tolerance factor (t) |
|---|---|---|---|
| $[GaO_2]^-$ | $Ga^{+3}$ | 1.24 | 0.99 |
| $[InO_2]^-$ | $In^{+3}$ | 0.11 | 0.91 |
| $[BeO_2]^{-2}$ | $Be^{+2}$ | 1.43 | 1.09 |
| $[MgO_2]^{-2}$ | $Mg^{+2}$ | 1.49 | 1.02 |
| $[LiO_2]^{-3}$ | $Li^+$ | 1.51 | 0.93 |

As shown in Table 1, it was confirmed that the first anionized layer was arranged as the interlayer between the electrode and the dielectric layer, and thus, the laminate including the interlayer having a cubic perovskite structure with a Goldschmidt tolerance factor (t) ranging from 0.9 to 1.10 had an increased Schottky barrier height.

This increase in the Schottky barrier height is considered to be because the first anionized layer induced screening charge having an opposite polarity to the corresponding electrode, and thus led to an additional electrostatic potential difference between the electrode and the dielectric layer.

Accordingly, it was confirmed that the first anionized layer disposed as the interlayer between the electrode and the dielectric layer is suitable as a leakage current blocking layer for the capacitor.

Evaluation Example 2: SBH Calculation when Second Anionized Layer was Included

An amount of change ($\Delta V$) of the Schottky barrier height (SBH) of a laminate, in which a first anionized layer is the interlayer between $SrRuO_3$ and $SrTiO_3$, with respect to a laminate of $SrRuO_3$ (electrode)/$SrTiO_3$ (dielectric) was calculated, and some of the results are shown in Table 2.

Referring to FIGS. 2A and 2B, the second anionized layer is arranged as the interlayer between $SrRuO_3$ and $SrTiO_3$. The metal cation included in the interlayer is located at a cuboctahedral site coordinated with 12 oxygen atoms in the perovskite structure, and corresponds to A in the composition of $ABO_3$. A dielectric constant and a bandgap were calculated in the framework of the density functional theory (DFT) using the Vienna Ab initio simulation package (VASP).

The Schottky barrier height (SBH) of a laminate with the interlayer arranged therein is represented by Equation 1. The Goldschmidt tolerance factor (t) is a parameter indicating the stability of a cubic perovskite structure. The closer to 1, the higher the stability of the cubic perovskite structure. The Goldschmidt tolerance factor (t) is represented by Equation 2.

TABLE 2

| Interlayer | Cation of Interlayer | Amount of change in SBH [eV] | Goldschmidt tolerance factor (t) |
|---|---|---|---|
| $[LiO]^-$ | $Li^+$ | 0.59 | 0.88 |
| $[NaO]^-$ | $Na^+$ | 0.96 | 0.98 |
| $[KO]^-$ | $K^+$ | 0.93 | 1.07 |
| $[RbO]^-$ | $Rb^+$ | 0.59 | 1.10 |
| $[SrO]$ | $Sr^{+2}$ | 0.0 | 1.00 |
| $[BaO]$ | $Ba^{+2}$ | 0.02 | 1.06 |
| $[YO]^+$ | $Y^{+3}$ | −0.62 | 0.93 |
| $[LaO]^+$ | $La^{+3}$ | −0.67 | 0.97 |
| $[SmO]^+$ | $Sm^{+3}$ | −0.65 | 0.93 |
| $[DyO]^+$ | $Dy^{+3}$ | −0.61 | 0.97 |

As shown in Table 2, it was confirmed that a second anodized layer was arranged as the interlayer with monovalent cations between the electrode and the dielectric layer, and thus, the Schottky barrier heights of the laminates were mostly increased, and the cubic perovskite structure was stable with a Goldschmidt tolerance factor (t) close to 1.

Accordingly, it was confirmed that the second anionized layer arranged as the interlayer between the electrode and the dielectric layer is suitable as a leakage current blocking layer for the capacitor.

Meanwhile, when a cationized layer was arranged as the interlayer between the electrode and the dielectric layer, the Schottky barrier heights of the laminates were rather reduced.

Evaluation Example 3: SBH Calculation when First Neutral Layer was Included

An amount of change ($\Delta V$) of the Schottky barrier height (SBH) of a laminate, in which a first neutral layer is arranged as the interlayer between $SrRuO_3$ and $SrTiO_3$, with respect to a laminate of $SrRuO_3$ (electrode)/$SrTiO_3$ (dielectric) was calculated, and some of the results are shown in Table 3.

Referring to FIGS. 3A and 3B, the first neutral layer is arranged as the interlayer between $SrRuO_3$ and $SrTiO_3$. The first neutral layer includes a perovskite compound having the composition of $ABO_3$.

A dielectric constant and a bandgap were calculated in the framework of the density functional theory (DFT) using the Vianna Ab initio simulation package (VASP).

TABLE 3

| Interlayer | Cation of Interlayer | Amount of change in SBH [eV] |
|---|---|---|
| $ScGaO_3$ | $Sc^{+3}$, $Ga^{+3}$ | 0.60 |
| $LaAlO_3$ | $La^{+3}$, $Al^{+3}$ | 0.50 |

As shown in Table 3, a first neutral layer was arranged as the interlayer between the electrode and the dielectric layer, and thus, the Schottky barrier heights of the laminates were increased.

Accordingly, it was confirmed that the first neutral layer arranged as the interlayer between the electrode and the dielectric layer is suitable as a leakage current blocking layer for the capacitor.

Evaluation Example 4: SBH Calculation with Thickness Changes

An amount of change ($\Delta V$) of the Schottky barrier height (SBH) according to thickness of the interlayer in a laminate, in which a first anionized layer or a cationized layer is arranged as the interlayer between $SrRuO_3$ and $SrTiO_3$, with respect to a laminate of $SrRuO_3$ (electrode)/$SrTiO_3$ (dielectric) was calculated, and some of the results are shown in Table 4. Referring to FIGS. 4A and 4B, the first aniodized layer is arranged as the interlayer between $SrRuO_3$ and $SrTiO_3$. The thickness of the interlayer corresponds to 1 unit cell or 2 unit cells.

A dielectric constant and a bandgap were calculated in the framework of the density functional theory (DFT) using the Vienna Ab initio simulation package (VASP).

TABLE 4

| Interlayer | Cation of Interlayer | Amount of change in SBH [eV] | Number of unit cells |
|---|---|---|---|
| $[GaO_2]^-$ | $Ga^{+3}$ | 1.24 | 1 |
| $[GaO_2]^-$ | $Ga^{+3}$ | 1.40 | 2 |
| $[YO]^+$ | $Y^{+3}$ | −0.65 | 1 |
| $[YO]^+$ | $Y^{+3}$ | −0.75 | 2 |

As shown in Table 4, the larger the thickness of the interlayer in the laminate with the first anionized layer arranged as the interlayer was, the larger the Schottky barrier height of the laminate became.

Accordingly, it was confirmed that as the thickness of the first anionized layer arranged as the interlayer between the electrode and the dielectric layer increased, the interlayer was suitable as a leakage current blocking layer for the capacitor.

Meanwhile, as the thickness of the interlayer in the laminates with the cationized layer as the interlayer increased, the Schottky barrier heights of the laminates were reduced.

Evaluation Example 5: Leakage Current Measurement

Leakage currents of the capacitors manufactured in Example 1, Example 12, Comparative Example 1, and Comparative Example 4 were measured.

A leakage current refers to a current density when a voltage of 1 V is applied to a capacitor. The measurement results are shown in Table 5.

TABLE 5

| | Interlayer | Thickness (number of unit cells) | Leakage current [A/cm²] |
|---|---|---|---|
| Example 1 | $[GaO_2]^-$ | 1 | $1.0 \times 10^{-5}$ |
| Example 12 | $[GaO_2]^-$ | 2 | $2.2 \times 10^{-6}$ |

TABLE 5-continued

| | Interlayer | Thickness (number of unit cells) | Leakage current [A/cm²] |
|---|---|---|---|
| Comparative Example 4 | — | 1 | $2.4 \times 10^{-4}$ |

As shown in Table 5, the capacitors of the Examples 1 and 12, each including the interlayer, had reduced current leakages, compared to the capacitor of Comparative Example 4, including no interlayer, and the capacitor of Comparative Example 1, including only the cationized interlayer.

Accordingly, it was confirmed that the capacitor including the interlayer is suitable for manufacturing a capacitor including a dielectric layer having a high dielectric constant.

As described above, according to one or more example embodiments, by including an interlayer having a novel structure, a capacitor may have reduced leakage current.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a first thin-film electrode layer;
   a second thin-film electrode layer;
   a dielectric layer between the first thin-film electrode layer and the second thin-film electrode layer; and
   an interlayer between the dielectric layer and at least one of the first thin-film electrode layer or the second thin-film electrode layer, the interlayer including a crystal with a structure of a same type as and a different composition from a crystal structure of at least one of the first thin-film electrode layer, the second thin-film electrode layer, or the dielectric layer,
   wherein the interlayer comprises at least one of a first anionized layer, a second anionized layer, or a first neutral layer,
   the first anionized layer including at least one of a monovalent cation, divalent cation, or trivalent cation of an atomic weight of 20 or more,
   the second anionized layer including a monovalent cation, and
   the first neutral layer including a plurality of trivalent cations, and
   wherein a thickness of the interlayer is less than a thickness of the dielectric layer.

2. The capacitor of claim 1, wherein the first anionized layer includes a composition represented by $[B1O_2]^{-a}$, wherein B1 represents the least one monovalent cation, divalent cation, or trivalent cation, and
   a is 1, 2, or 3.

3. The capacitor of claim 2, wherein B1 is at least one of Li, Na, K, Rb, Cs, Mg, Be, Ba, Ca, Ga, or In.

4. The capacitor of claim 1, wherein the first anionized layer includes a composition represented by at least one of $[GaO_2]^-$, $[InO_2]^-$, $[BeO_2]^{-2}$, $[MgO_2]^{-2}$, $[BaO_2]^{-2}$, $[CaO_2]^{-2}$, $[LiO_2]^{-3}$, $[NaO_2]^{-3}$, $[KO_2]^{-3}$, or $[RbO_2]^{-3}$.

5. The capacitor of claim 1, wherein the interlayer comprises the first anionized layer, and further comprises:
a second neutral layer including a composition represented by [A1O], wherein A1 is a divalent cation.

6. The capacitor of claim 5, wherein A1 is at least one of Sr, Ca, Ba, Mg, or Be.

7. The capacitor of claim 5, wherein the composition of the second neutral layer is represented by at least one of [SrO], [CaO], [BaO], [MgO], or [BeO].

8. The capacitor of claim 1, wherein
the interlayer comprises the first anionized layer and a second neutral layer,
the first anionized layer and the second neutral layer are alternately stacked, and
the first anionized layer and the second neutral layer comprise different metals from each other.

9. The capacitor of claim 1, wherein the interlayer includes a metal oxide having a perovskite-type crystal structure and is represented by Formula 1:

[A1B1O$_x$]  <Formula 1> wherein, A1 is a divalent cation, B1 is the at least one monovalent cation, divalent cation, or trivalent cation, and 2.5<x≤3.0.

10. The capacitor of claim 1, wherein
the interlayer includes a metal oxide represented by at least one of
[SrGaO$_x$], [CaGaO$_x$], [BaGaO$_x$], [PbGaO$_x$], [SrInO$_x$], [CaInO$_x$], [BaInO$_x$], [PbInO$_x$], [SrBeO$_x$], [CaBeO$_x$], [BaBeO$_x$], [PbBeO$_x$], [SrMgO$_x$], [CaMgO$_x$], [BaMgO$_x$], [PbMgO$_x$], [SrBaO$_x$], [CaBaO$_x$], [PBBaO$_x$], [SrCaO$_x$], [BaCaO$_x$], [PbCaO$_x$], [SrLiO$_x$], [CaLiO$_x$], [BaLiO$_x$], [PbLiO$_x$], [SrNaO$_x$], [CaNaO$_x$], [BaNaO$_x$], [PbNa$_x$], [SrKO$_x$], [CaKO$_x$], [BaKO$_x$], [PbKO$_x$], [SrRbO$_x$], [CaRbO$_x$], [BaRbO$_x$], or [PbRbO$_x$], and
wherein 2.5<x≤3.0.

11. The capacitor of claim 1, wherein the interlayer includes the second anionized layer, and the second anionized layer includes a composition represented by [A2O]-, wherein A2 is the monovalent cation of the second anionized layer.

12. The capacitor of claim 11, wherein A2 is at least one of Li, Na, K, Rb, or Cs.

13. The capacitor of claim 11, wherein the composition of the second anionized layer is represented by at least one of [LiO]$^-$, [NaO]$^-$, [KO]$^-$, or [RbO]$^-$.

14. The capacitor of claim 1, wherein the interlayer comprises the second anionized layer and further comprises:
a third neutral layer including a composition represented by [B2O$_2$], wherein B2 is a tetravalent cation.

15. The capacitor of claim 14, wherein B2 is at least one of Ti, Hf, or Zr.

16. The capacitor of claim 14, wherein the composition of the third neutral layer is represented by at least one of [TiO$_2$], [ZrO$_2$], or [HfO$_2$].

17. The capacitor of claim 1, wherein the interlayer includes a metal oxide having a perovskite-type crystal structure and is represented by Formula 2:

[A2B2O$_x$]  <Formula 2> wherein, in Formula 2, A2 is the monovalent cation of the second anionized layer, B2 is a tetravalent cation, and 2.5≤x≤3.0.

18. The capacitor of claim 1, wherein the interlayer includes a metal oxide represented by at least one of [LiTiO$_x$], [NaTiO$_x$], [KTiO$_x$], [RbTiO$_x$], [LiZrO$_x$], NaZrO$_x$], [KzrO$_x$], [RbZrO$_x$], [LiHfO$_x$], [NaHfO$_x$], [KhfO$_x$], or [RbHfO$_x$], and
wherein 2.5<x≤3.0.

19. The capacitor of claim 1, wherein the first neutral layer includes a metal oxide that has a perovskite-type crystal structure and is represented by Formula 3:

[A3B3O$_3$]  <Formula 3> wherein, in Formula 3, A3 and B2 are the plurality of trivalent cations.

20. The capacitor of claim 1, wherein the interlayer includes a metal oxide represented by at least one of [ScAlO$_3$], [YalO$_3$], [LaAlO$_3$], [CeAlO$_3$], [PrAlO$_3$], [NdAlO$_3$], [SmAlO$_3$], [DyAlO$_3$], [ScGaO$_3$], [YgaO$_3$], [LaGaO$_3$], [CeGaO$_3$], [PrGaO$_3$], [NdGaO$_3$], [SmGaO$_3$], [DyGaO$_3$], [ScInO$_3$], [YinO$_3$], [LaInO$_3$], [CeInO$_3$], [PrInO$_3$], [NdInO$_3$], [SmInO$_3$], or [DyInO$_3$].

21. The capacitor of claim 1, wherein the first neutral layer comprises:
a first cationized layer including a composition represented by [A3O]$^+$; and
a third anionized layer including a composition represented by [B3O$_2$]$^-$,
wherein A3 and B3 are the plurality of trivalent cations, and A3 and B3 are different metals from each other.

22. The capacitor of claim 21, wherein
A3 is at least one of Sc, Y, La, Ce, Pr, Nd, Sm, or Dy, and
B3 is at least one of Al, Ga, or In.

23. The capacitor of claim 21, wherein
the composition of the first cationized layer is represented by at least one of [ScO]$^+$, [YO]$^+$, [LaO]$^+$, [CeO]$^+$, [PrO]$^+$, [NdO]$^+$, [SmO]$^+$, or [DyO]$^+$; and
the composition of the third anionized layer is represented by at least one of [AlO$_2$]$^-$, [GaO$_2$]$^-$, or [InO$_2$]$^-$.

24. The capacitor of claim 1, wherein
the interlayer comprises one to three unit cells,
the thickness of the interlayer is about 1Å to about 15Å,
a Schottky barrier height (SBH) between at least one of the first thin-film electrode layer and the dielectric layer or the second thin-film electrode layer and the dielectric layer is 1.5 eV or more.

25. The capacitor of claim 1, wherein the dielectric layer includes an oxide that has a perovskite-type crystal structure and is represented by Formula 4:

A4B4O$_3$  <Formula 4> wherein, in Formula 4, A4 is a monovalent, divalent, or trivalent cation, and B4 is a trivalent, tetravalent, or pentavalent cation.

26. The capacitor of claim 1, wherein the dielectric layer includes an oxide represented by at least one of SrTiO$_3$, CaTiO$_3$, BaTiO$_3$, SrHfO3, CaHfO$_3$, BaHfO$_3$, SrZrO$_3$, CaZrO$_3$, BaZrO$_3$, PbTiO$_3$, NaNbO$_3$, NaTaO$_3$, RbTaO$_3$, RbNbO$_3$, RbTaO$_3$ or EuTiO$_3$.

27. The capacitor of claim 1, wherein
the thickness of the dielectric layer is about 10 nm to about 100 nm,
the first thin-film electrode layer and the second thin-film electrode layer each independently have a thickness of about 10 nm to about 1000 nm, and
at least one of the first thin-film electrode layer and the second thin-film electrode layer has a perovskite-type crystal structure.

28. An electronic device comprising the capacitor of claim 1.

29. The electronic device of claim 28, wherein the electronic device is a semiconductor device.

30. The electronic device of claim 29, wherein the semiconductor device is a memory device.

31. A method of manufacturing a capacitor, the method comprising:
providing a thin-film electrode layer;
epitaxially growing an interlayer on a surface of the thin-film electrode layer;
disposing a dielectric layer on the interlayer such that a thickness of the dielectric layer is greater than a thickness of the interlayer; and
disposing another thin-film electrode layer on the dielectric layer,
wherein the interlayer has a crystal with a structure of the same type as and a different composition from a crystal structure of at least one of the thin-film electrode layer or the dielectric layer that contact the interlayer,
the interlayer comprises at least one of a first anionized layer, a second anionized layer, or a first neutral layer,
the first anionized layer includes at least one of a monovalent cation, a divalent cation, or a trivalent cation that has an atomic weight of 20 or more,
the second anionized layer includes a monovalent cation, and
the first neutral layer includes a plurality of trivalent cations.

32. A capacitor including:
first and second thin-film electrode layers, at least one of the first and second thin-film electrode layers including a conductive perovskite-type crystal structure;
a dielectric layer between the first and second thin-film layers, the dielectric layer including a dielectric perovskite-type crystal structure; and
an interlayer connecting the dielectric perovskite-type crystal structure and the conductive perovskite-type crystal structure, wherein a thickness of the interlayer is less than a thickness of the dielectric layer,
wherein, one of the dielectric perovskite-type crystal structure or the conductive perovskite-type crystal structure includes a ternary oxide including an A cation located at a cuboctahedral site and a B cation located at a octahedral site, and
wherein the interlayer includes a first cation located at the cuboctahedral site and a second cation located at the octahedral site, and
wherein the first cation has a lower valency than the A cation at a corresponding A-cation site of the ternary oxide and/or the second cation has a lower valency than the B cation at a corresponding B-cation site of the ternary oxide.

33. The capacitor of claim 32, wherein the A cation is a divalent cation and the first cation is a monovalent cation.

34. The capacitor of claim 32, wherein the B cation is a tetravalent cation, and the second cation is at least one of a monovalent cation, divalent cation, or trivalent cation.

35. The capacitor of claim 32, wherein
the interlayer includes an anionized layer and a neutral layer,
the anionized layer including the first cation and the second cation,
the neutral layer including an oxide with a perovskite-type crystal structure,
the neutral layer has cations of a same valency as the A cation and the B cation.

36. The capacitor of claim 32, wherein
the interlayer comprises one to three unit cells, and
a Schottky barrier height (SBH) between the dielectric perovskite-type crystal structure and the conductive perovskite-type crystal structure connected by the interlayer is 1.5 eV or more.

* * * * *